(12) United States Patent
Obata et al.

(10) Patent No.: US 8,309,963 B2
(45) Date of Patent: *Nov. 13, 2012

(54) ORGANIC LUMINESCENCE TRANSISTOR DEVICE AND MANUFACTURING METHOD THEREOF

(75) Inventors: Katsunari Obata, Kashiwa (JP); Shinichi Handa, Tsukuba (JP); Takuya Hata, Tsurugashima (JP); Kenji Nakamura, Tsurugashima (JP); Atsushi Yoshizawa, Tsurugashima (JP); Hiroyuki Endo, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 228 days.

This patent is subject to a terminal disclaimer.

(21) Appl. No.: 12/659,164

(22) Filed: Feb. 26, 2010

(65) Prior Publication Data

US 2010/0176384 A1    Jul. 15, 2010

Related U.S. Application Data

(62) Division of application No. 12/085,682, filed as application No. PCT/JP2006/324107 on Dec. 1, 2006, now Pat. No. 8,158,970.

(30) Foreign Application Priority Data

Dec. 2, 2005 (JP) ................... 2005-348754

(51) Int. Cl.
   *H01L 27/14* (2006.01)
(52) U.S. Cl. ............................ 257/72; 257/40
(58) Field of Classification Search .......... 257/72
   See application file for complete search history.

(56) References Cited

U.S. PATENT DOCUMENTS

| 7,030,258 | B2 | 4/2006 | Takahashi et al. |
| 2001/0001724 | A1* | 5/2001 | Kwok et al. ................. 438/585 |
| 2002/0167280 | A1* | 11/2002 | Hayashi et al. ............ 315/169.3 |

(Continued)

FOREIGN PATENT DOCUMENTS

JP    A-2002-260843    9/2002

(Continued)

OTHER PUBLICATIONS

Nov. 24, 2010 Office Action issued in U.S. Appl. No. 12/085,682.

(Continued)

*Primary Examiner* — Thao Le
*Assistant Examiner* — Geoffrey Ida
(74) *Attorney, Agent, or Firm* — Oliff & Berridge, PLC

(57) ABSTRACT

The invention is an organic luminescence transistor device including: a substrate; an assistance electrode layer provided on a side of an upper surface of the substrate; an insulation film provided on a side of an upper surface of the assistance electrode layer; a first electrode provided locally on a side of an upper surface of the insulation film, the first electrode covering an area of a predetermined size; an electric-charge-injection inhibiting layer provided on an upper surface of the first electrode, the electric-charge-injection inhibiting layer having a shape larger than that of the first electrode in a plan view; an electric-charge injection layer provided on the side of an upper surface of the insulation film at an area not provided with the first electrode or the electric-charge-injection inhibiting layer and on an upper surface of the electric-charge-injection inhibiting layer; a luminescent layer provided on an upper surface of the electric-charge injection layer; and a second electrode layer provided on a side of an upper surface of the luminescent layer.

14 Claims, 11 Drawing Sheets

U.S. PATENT DOCUMENTS

2005/0263756 A1 12/2005 Yatsunami et al.

FOREIGN PATENT DOCUMENTS

| JP | A-2002-343578 | 11/2002 |
| JP | A-2003-282256 | 10/2003 |
| JP | A-2003-324203 | 11/2003 |
| JP | A-2005-243871 | 9/2005 |
| JP | A-2005-327797 | 11/2005 |
| KR | 2004-0111075 A | 12/2004 |

OTHER PUBLICATIONS

Kudo et al., "Current Conditions and Future Prospects of Organic Transistor," *Journal of Applied Physics*, vol. 12, No. 9, pp. 1151-1156 (2003) with abstract.

Nakamura et al., "Fabrication of vertical-type organic light-emitting transistors," *The Japan Society of Applied Physics*, p. 1177 (Sep. 7, 2005).

Endoh et al., "High performance organic light-emitting transistors," *The Institute of Electronics*, vol. 103, No. 698, p. 29, (Sep. 7, 2005) with abstract.

May 28, 2010 Office Action issued in U.S. Appl. No. 12/085,682.

Korean Office Action dated Jun. 7, 2012 issued in Korean Patent Application No. 10-2008-7015760 (with translation).

* cited by examiner

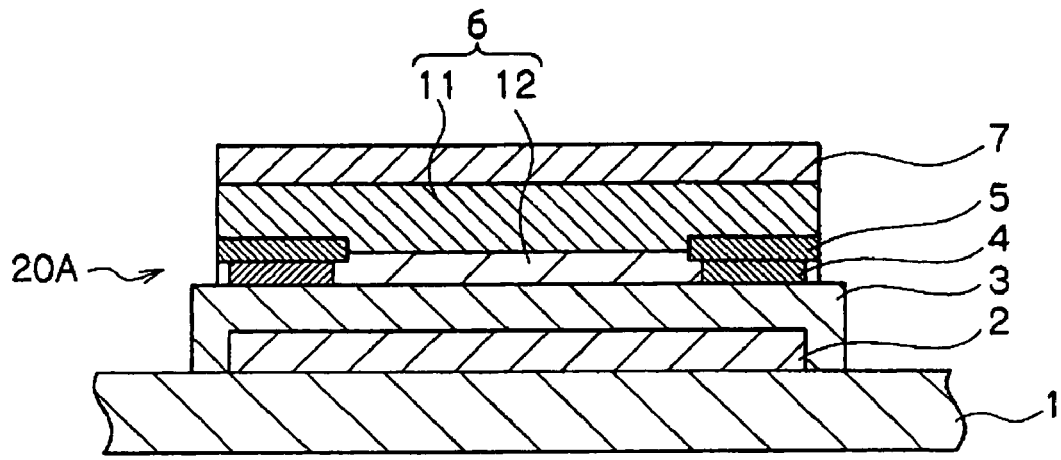
F I G. 3 A
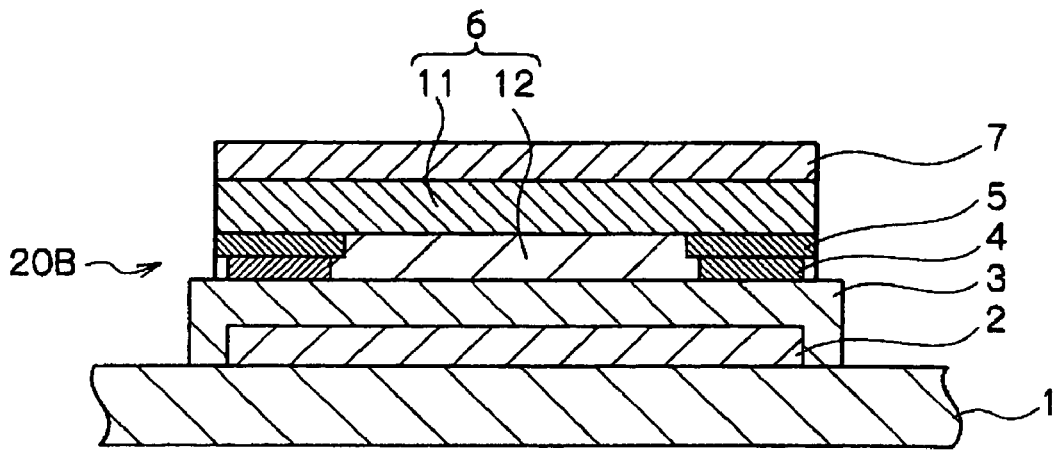
F I G. 3 B
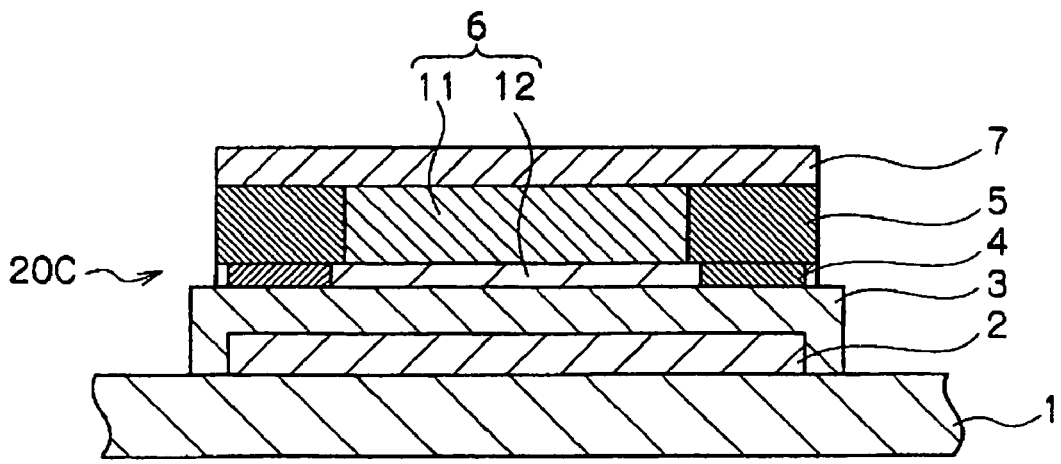
F I G. 3 C

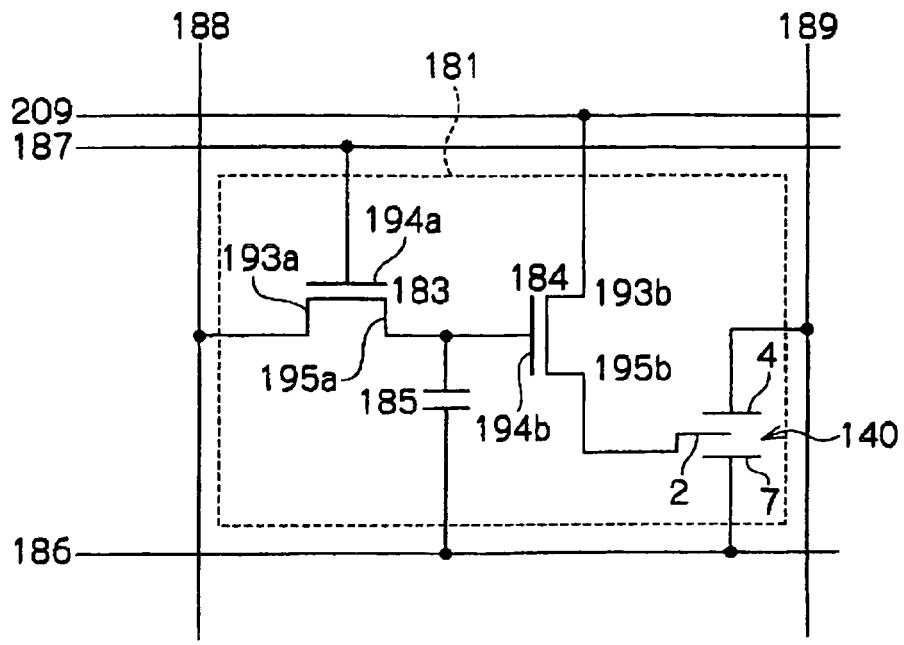
F I G. 1 5
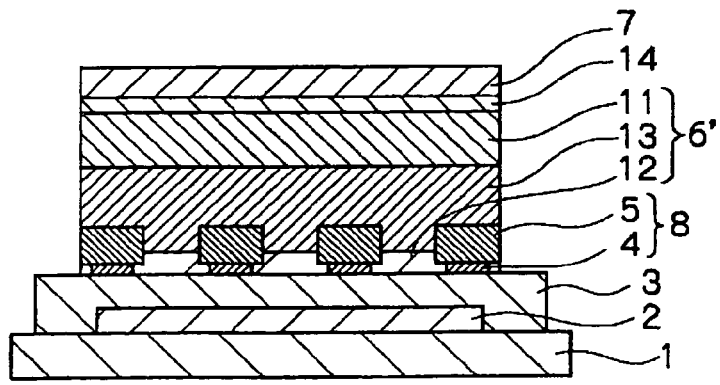
F I G. 1 6
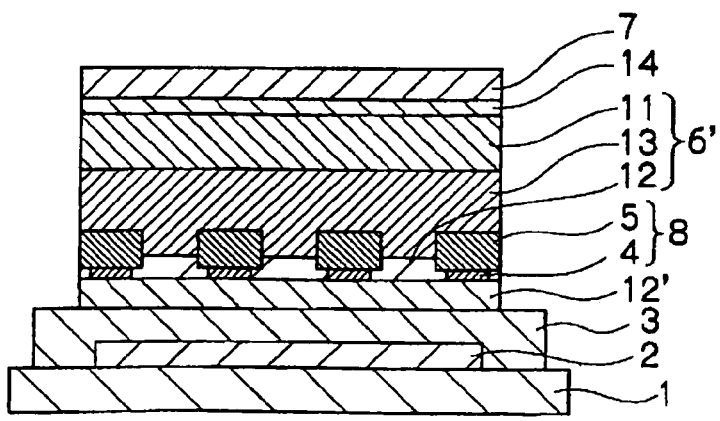
F I G. 1 7

ORGANIC LUMINESCENCE TRANSISTOR DEVICE AND MANUFACTURING METHOD THEREOF

CROSS REFERENCE

This is a Division of application Ser. No. 12/085,682 filed Jul. 25, 2008. The disclosure of the prior application is hereby incorporated by reference herein in its entirety.

FIELD OF THE INVENTION

This invention relates to an organic luminescence transistor device and a manufacturing method thereof. In more details, in a vertical type of organic luminescence transistor device, this invention relates to an organic luminescence transistor device and a manufacturing method thereof wherein a current control between an anode and a cathode is facilitated.

BACKGROUND ART

An organic electroluminescence device has a simple structure, so that it has been expected as a luminescence device for the next generation display that is thinner, lighter, larger area and less costly. Thus, recently, the organic electroluminescence device has been studied hard.

As a driving method for driving the organic electroluminescence device, an active-matrix type of filed effect transistor (FET) that uses a thin film transistor (TFT) is considered to be advantageous in terms of operational speed and power consumption. On the other hand, as a semiconductor material for forming the thin film transistor, inorganic semiconductor materials such as a silicon semiconductor or a chemical compound semiconductor have been studied, but recently, an organic thin film transistor (organic TFT) that uses an organic semiconductor material has been also studied hard. The organic semiconductor material has been expected as a semiconductor material of the next generation. However, the organic semiconductor material has problems of a lower charge-transfer level and of a higher resistance, compared with the inorganic semiconductor material.

Regarding the filed effect transistor, a vertical FET structured type of static induction transistor (SIT) wherein the structure thereof is vertically arranged is recognized to be advantageous because a channel width of the transistor can be shortened, the whole electrode of the surface thereof can be effectively used so that rapid response and/or power enhancement can be achieved, and interface effect can be made smaller.

Accordingly, recently, based on the above advantageous features of the static induction transistor (SIT), an organic luminescence transistor composed of such an SIT structure and an organic electroluminescence device structure has been studied to be developed (for example, Kazuhiro Kudo, "Current Conditions and Future Prospects of Organic Transistor", J. Appl. Phys. Vol. 72, No. 9, pp. 1151-1156 (2003); JP-A-2003-324203 (in particular, claim 1); JP-A-2002-343578.

FIG. 18 is a schematic sectional view showing an example of an organic luminescence transistor composed of an SIT structure and an organic electroluminescence device structure, described in the above document "Current Conditions and Future Prospects of Organic Transistor". As shown in FIG. 18, the organic luminescence transistor 101 has a vertical type of FET structure wherein a source electrode 103 consisting of a transparent electrode film, a hole-transfer layer 104 in which slit-like Schottky electrodes 105 are embedded, a luminescent layer 106, and a drain electrode 107 are layered on a glass substrate 102 in this order.

As described above, in the composite type of organic luminescence transistor 101, the slit-like Schottky electrodes 105 are embedded in the hole-transfer layer 104. A Schottky barrier junction is formed between the hole-transfer layer 104 and the gate electrode 105, so that a depletion layer is formed in the hole-transfer layer 104. The expansion of the depletion layer is varied by the gate voltage (voltage applied between the source electrode 103 and the gate electrode 105). Thus, a channel width is controlled by varying the gate voltage, and an amount of generated charge is varied by controlling a voltage to be applied between the source electrode 103 and the drain electrode 107.

FIG. 19 is a schematic sectional view showing an example of an organic luminescence transistor composed of an FET structure and an organic electroluminescence device structure, described in JP-A-2002-343578. As shown in FIG. 19, the organic luminescence transistor 111 has a substrate 112, on which an assistance electrode 113 and an insulation layer 118 are layered. Then, an anode 115 is partially formed on the insulation layer 118. Furthermore, a luminescent material layer 116 is formed on the insulation layer 118 such that the luminescent material layer 116 covers the anode 115. A cathode 117 is formed on the luminescent material layer 116. An anode buffer layer 119 is formed on the anode 115. The anode buffer layer 119 has a function of allowing passage of holes from the anode 115 to the luminescent material layer 116 but blocking passage of electrons from the luminescent material layer 116 to the anode 115. In the organic luminescence transistor 111 as well, a channel width is controlled by varying a voltage to be applied between the assistance electrode 113 and the anode 115, and an amount of generated charge is varied by controlling a voltage to be applied between the anode 115 and the cathode 117.

SUMMARY OF THE INVENTION

In the organic luminescence transistor composed of an SIT structure and an organic electroluminescence device structure, described in the above document and the above patent publications, with reference to FIG. 19, when a certain voltage (−Vd1<0) is applied between the anode 115 and the cathode 117, many positive holes are generated on a surface of the anode 115 opposite to the cathode 117, and the holes flow toward the cathode 117 (a flow of electric charges is formed). Herein, when a voltage Vd=−Vd2<<−Vd1 is applied between the anode 115 and the cathode 117 in order to obtain a greater flow of electric charges (i.e., in order to obtain a greater luminance), generation of the electric charges between the anode 115 and the cathode 117 and a flow thereof become dominant. Thus, the amount of the generated electric charges cannot be controlled by controlling the voltage (Vg) to be applied between the assistance electrode 113 and the anode 115, so that it is difficult to control the amount of the luminescence.

The present invention is accomplished in order to solve the aforementioned problems. An object of the present invention is to provide a vertical type of organic luminescence transistor device and a manufacturing method thereof wherein a current control between an anode and a cathode is facilitated.

The present invention is an organic luminescence transistor device comprising: a substrate; an assistance electrode layer provided on a side of an upper surface of the substrate; an insulation film provided on a side of an upper surface of the assistance electrode layer; a first electrode provided locally on a side of an upper surface of the insulation film, the first electrode covering an area of a predetermined size; an electric-charge-injection inhibiting layer provided on an upper surface of the first electrode, the electric-charge-injection inhibiting layer having a shape larger than that of the first electrode in a plan view; an electric-charge injection layer provided on the side of an upper surface of the insulation film at an area not provided with the first electrode or the electric-charge-injection inhibiting layer and on an upper surface of the electric-charge-injection inhibiting layer; a luminescent layer provided on an upper surface of the electric-charge injection layer; and a second electrode layer provided on a side of an upper surface of the luminescent layer.

Alternatively, the present invention is an organic luminescence transistor device comprising: a substrate; an assistance electrode layer provided on a side of an upper surface of the substrate; an insulation film provided on a side of an upper surface of the assistance electrode layer; a first electrode provided locally on a side of an upper surface of the insulation film, the first electrode covering an area of a predetermined size; an electric-charge-injection inhibiting layer provided on an upper surface of the first electrode, the electric-charge-injection inhibiting layer having a shape larger than that of the first electrode in a plan view; an electric-charge injection layer provided on the side of an upper surface of the insulation film at an area not provided with the first electrode or the electric-charge-injection inhibiting layer; a luminescent layer provided on an upper surface of the electric-charge-injection inhibiting layer and on an upper surface of the electric-charge injection layer; and a second electrode layer provided on a side of an upper surface of the luminescent layer.

Alternatively, the present invention is an organic luminescence transistor device comprising: a substrate; an assistance electrode layer provided on a side of an upper surface of the substrate; an insulation film provided on a side of an upper surface of the assistance electrode layer; a first electrode provided locally on a side of an upper surface of the insulation film, the first electrode covering an area of a predetermined size; an electric-charge injection layer provided on the side of an upper surface of the insulation film at an area not provided with the first electrode; an electric-charge-injection inhibiting layer provided on the whole upper surface of the first electrode and on a partial upper surface of the electric-charge injection layer, the electric-charge-injection inhibiting layer having a shape larger than that of the first electrode in a plan view; a luminescent layer provided on the upper surface of the electric-charge injection layer at an area not provided with the electric-charge-injection inhibiting layer; and a second electrode layer provided on a side of an upper surface of the electric-charge-injection inhibiting layer and on a side of an upper surface of the luminescent layer.

According to the organic luminescence transistor device having any of the above structures, when a constant voltage is applied between the first electrode and the second electrode and a variable voltage is applied between the assistance electrode and the first electrode, an amount of luminescence can be controlled.

According to the organic luminescence transistor device having any of the above structures, since there is provided on the first electrode the electric-charge-injection inhibiting layer having a shape larger than that of the first electrode in a plan view, when a constant voltage is applied between the first electrode and the second electrode, generation of electric charges (positive holes or electrons) on an upper surface and an upper peripheral edge (contour edge) of the first electrode is inhibited, and the flow of the electric charges toward the second electrode is inhibited. For example, the electric charges generated at the first electrode are mainly generated at both edge surfaces (both lateral surfaces), each of which has a small area, not provided with the electric-charge-injection inhibiting layer. The thus generated electric charges are efficiently injected into the electric-charge injection layer which is adjacent to the both edge surfaces, and then flow (move) toward the second electrode. Thus, under a condition wherein a constant voltage is applied between the first electrode and the second electrode, a current value between the first electrode and the second electrode can be inhibited. As a result, by controlling the voltage to be applied between the assistance electrode and the first electrode, the electric current flowing between the first electrode and the second electrode can be controlled, so that the amount of the luminescence can be controlled. In particular, according to the present invention, since the shape of the electric-charge-injection inhibiting layer is greater than that of the first electrode (for example, an edge portion of the first electrode is inside an edge portion of the electric-charge-injection inhibiting layer), the voltage to be applied between the assistance electrode and the first electrode may have less direct effect on the electric current flowing between the first electrode and the second electrode.

In the above description, it is preferable that a thickness of the electric-charge injection layer is greater than a thickness of the first electrode. In the case, at least an edge portion of the first electrode comes in contact with the electric-charge injection layer, which is preferable. Furthermore, in the case, one or more luminescent layers may be formed between layered structures, each of which consists of the first electrode and the electric-charge-injection inhibiting layer, so as to form a matrix-patterned device. More specifically, it is preferable that a thickness of the electric-charge injection layer is substantially the same as or greater than a total thickness of the first electrode and the electric-charge-injection inhibiting layer.

In addition, it is preferable that the electric-charge injection layer is made of a coat-type electric-charge injection material. In the case, in a step of forming the electric-charge injection layer, the fluid coat-type material can easily reach an edge portion of the first electrode located inside an edge portion of the electric-charge-injection inhibiting layer. As a result, the electric charges generated at the edge portion of the first electrode can be efficiently injected into the electric-charge injection layer which is in contact with the edge portion.

In addition, a second electric-charge injection layer made of the same material as or a different material from the electric-charge injection layer may be provided between the insulation film and the first electrode and the electric-charge injection layer. In the case, the electric charges may be generated at a surface of the first electrode on a side of the insulation film as well. The flow of the electric charges generated at the surface of the first electrode on a side of the insulation film can be also controlled by the voltage to be applied between the assistance electrode and the first electrode, so that the electric current between the first electrode and the second electrode can be controlled, that is, the amount of the luminescence can be controlled.

In addition, it is preferable that a third electric-charge injection layer for the second electrode layer is provided between the luminescent layer and the second electrode layer. In the case, according to the same principle as the electric-charge injection layer provided adjacent to the first electrode, injection of the electric charges into the luminescent layer can be facilitated because of the third electric-charge injection layer provided adjacent to the second electrode.

Furthermore, in the case, it is preferable that an electric-charge transfer layer is provided between the luminescent layer and the third electric-charge injection layer, in order to improve performance of the electric-charge transfer.

In addition, the electric-charge-injection inhibiting layer is preferably made of an insulation material, more preferably a photoresist material. In the case, a forming step of the electric-charge-injection inhibiting layer on the first electrode is easy. In addition, accuracy of dimension in forming the electric-charge-injection inhibiting layer can be enhanced.

For example, the first electrode functions as an anode, and the second electrode functions as a cathode. Alternatively, the first electrode functions as a cathode, and the second electrode functions as an anode. Whichever polarity the first electrode and the second electrode have, the amount of the electric charges can be sensitively varied by controlling the voltage (gate voltage) to be applied between the assistance electrode and the first electrode. Thus, the electric current between the first electrode and the second electrode is controlled, so that the amount of the luminescence can be controlled sensitively.

In addition, the present invention is an organic luminescence transistor comprising: an organic luminescence transistor device having any of the above features; a first voltage-feeding unit configured to apply a constant voltage between the first electrode and the second electrode of the organic luminescence transistor device; and a second voltage-feeding unit configured to apply a variable voltage between the first electrode and the assistance electrode of the organic luminescence transistor device.

According to the present invention, by means of the first voltage-feeding unit and the second voltage-feeding unit, a constant voltage can be applied between the first electrode and the second electrode, and a variable voltage can be applied between the first electrode and the assistance electrode. As a result, the amount of the electric charges can be sensitively varied, so that the electric current between the first electrode and the second electrode is controlled and the amount of the luminescence can be controlled sensitively.

In addition, the present invention is a luminescence display apparatus comprising a plurality of luminescent parts arranged in a matrix pattern, wherein each of the plurality of luminescent parts has an organic luminescence transistor device having any of the above features.

According to the luminescence display apparatus, the amount of the luminescence can be easily controlled, so that the luminance can be easily adjusted.

In addition, the present invention is a manufacturing method of an organic luminescence transistor device, the manufacturing method comprising the steps of: preparing a substrate on which an assistance electrode layer and an insulation film has been formed in this order; providing a first electrode locally on a side of an upper surface of the insulation film such that the first electrode covers an area larger than a predetermined size in a plan view; providing an electric-charge-injection inhibiting layer on an upper surface of the first electrode such that the electric-charge-injection inhibiting layer has a shape larger than the predetermined size of the first electrode in a plan view; etching an edge portion of the first electrode until the edge portion of the first electrode is located inside an edge portion of the electric-charge-injection inhibiting layer such that the first electrode is made into the predetermined size; providing an electric-charge injection layer by coating the upper surface of the insulation film at an area not provided with the first electrode or the electric-charge-injection inhibiting layer, with a coat-type electric-charge injection material, after the step of etching; providing another electric-charge injection layer on an upper surface of the electric-charge-injection inhibiting layer; providing a luminescent layer on an upper surface of the electric-charge injection layer; and providing a second electrode layer on a side of an upper surface of the luminescent layer.

Alternatively, the present invention is a manufacturing method of an organic luminescence transistor device, the manufacturing method comprising the steps of: preparing a substrate on which an assistance electrode layer and an insulation film has been formed in this order; providing a first electrode locally on a side of an upper surface of the insulation film such that the first electrode covers an area larger than a predetermined size in a plan view; providing an electric-charge-injection inhibiting layer on an upper surface of the first electrode such that the electric-charge-injection inhibiting layer has a shape larger than the predetermined size of the first electrode in a plan view; etching an edge portion of the first electrode until the edge portion of the first electrode is located inside an edge portion of the electric-charge-injection inhibiting layer such that the first electrode is made into the predetermined size; providing an electric-charge injection layer by coating the upper surface of the insulation film at an area not provided with the first electrode or the electric-charge-injection inhibiting layer, with a coat-type electric-charge injection material, after the step of etching; providing a luminescent layer on an upper surface of the electric-charge-injection inhibiting layer and on an upper surface of the electric-charge injection layer; and providing a second electrode layer on a side of an upper surface of the luminescent layer.

Alternatively, the present invention is a manufacturing method of an organic luminescence transistor device, the manufacturing method comprising the steps of: preparing a substrate on which an assistance electrode layer and an insulation film has been formed in this order; providing a first electrode locally on a side of an upper surface of the insulation film such that the first electrode covers an area larger than a predetermined size in a plan view; providing an electric-charge-injection inhibiting layer on an upper surface of the first electrode such that the electric-charge-injection inhibiting layer has a shape larger than the predetermined size of the first electrode in a plan view; etching an edge portion of the first electrode until the edge portion of the first electrode is located inside an edge portion of the electric-charge-injection inhibiting layer such that the first electrode is made into the predetermined size; providing an electric-charge injection layer by coating the upper surface of the insulation film at an area not provided with the first electrode, with a coat-type electric-charge injection material, after the step of etching; providing a luminescent layer on an upper surface of the electric-charge injection layer; and providing a second electrode layer on a side of an upper surface of the electric-charge-injection inhibiting layer and on a side of an upper surface of the luminescent layer.

Alternatively, the present invention is a manufacturing method of an organic luminescence transistor device, the manufacturing method comprising the steps of: preparing a substrate on which an assistance electrode layer and an insulation film has been formed in this order; providing a first electrode locally on a side of an upper surface of the insulation film such that the first electrode covers an area of a predetermined size; providing an electric-charge injection layer on the side of an upper surface of the insulation film at an area not provided with the first electrode; providing an electric-charge-injection inhibiting layer on the whole upper surface of the first electrode and on a partial upper surface of the electric-charge injection layer such that the electric-charge-injection inhibiting layer has a shape larger than that of the first electrode in a plan view; providing another electric-charge injection layer on the upper surface of the electric-charge injection layer at an area not provided with the electric-charge-injection inhibiting layer; providing another electric-charge injection layer on an upper surface of the electric-charge-injection inhibiting layer; providing a luminescent layer on an upper surface of the electric-charge injection layer; and providing a second electrode layer on a side of an upper surface of the luminescent layer.

Alternatively, the present invention is a manufacturing method of an organic luminescence transistor device, the manufacturing method comprising the steps of: preparing a substrate on which an assistance electrode layer and an insulation film has been formed in this order; providing a first electrode locally on a side of an upper surface of the insulation film such that the first electrode covers an area of a predetermined size; providing an electric-charge injection layer on the side of an upper surface of the insulation film at an area not provided with the first electrode; providing an electric-charge-injection inhibiting layer on the whole upper surface of the first electrode and on a partial upper surface of the electric-charge injection layer such that the electric-charge-injection inhibiting layer has a shape larger than that of the first electrode in a plan view; providing another electric-charge injection layer on the upper surface of the electric-charge injection layer at an area not provided with the electric-charge-injection inhibiting layer; providing another electric-charge injection layer on an upper surface of the electric-charge-injection inhibiting layer; providing a luminescent layer on an upper surface of the electric-charge-injection inhibiting layer and on an upper surface of the electric-charge injection layer; and providing a second electrode layer on a side of an upper surface of the luminescent layer.

Alternatively, the present invention is a manufacturing method of an organic luminescence transistor device, the manufacturing method comprising the steps of: preparing a substrate on which an assistance electrode layer and an insulation film has been formed in this order; providing a first electrode locally on a side of an upper surface of the insulation film such that the first electrode covers an area of a predetermined size; providing an electric-charge injection layer on the side of an upper surface of the insulation film at an area not provided with the first electrode; providing an electric-charge-injection inhibiting layer on the whole upper surface of the first electrode and on a partial upper surface of the electric-charge injection layer such that the electric-charge-injection inhibiting layer has a shape larger than that of the first electrode in a plan view; providing a luminescent layer on the upper surface of the electric-charge injection layer at an area not provided with the electric-charge-injection inhibiting layer; and providing a second electrode layer on a side of an upper surface of the electric-charge-injection inhibiting layer and on a side of an upper surface of the luminescent layer.

According to any of the above manufacturing methods of an organic luminescence transistor device, it is possible to efficiently manufacture the organic luminescence transistor device.

Preferably, a step of providing a second electric-charge injection layer made of the same material as or a different material from the electric-charge injection layer on the upper surface of the insulation film is conducted, before the step of providing the first electrode.

In addition, the present invention is an organic transistor device comprising: a substrate; an assistance electrode layer provided on a side of an upper surface of the substrate; an insulation film provided on a side of an upper surface of the assistance electrode layer; a first electrode provided locally on a side of an upper surface of the insulation film, the first electrode covering an area of a predetermined size; an electric-charge-injection inhibiting layer provided on an upper surface of the first electrode, the electric-charge-injection inhibiting layer having a shape larger than that of the first electrode in a plan view; an organic semiconductor layer provided on the side of an upper surface of the insulation film at an area not provided with the first electrode and the electric-charge-injection inhibiting layer; and a second electrode layer provided on a side of an upper surface of the organic semiconductor layer.

BRIEF DESCRIPTION OF THE DRAWINGS

FIGS. 3A to 3C are respectively schematic sectional views showing organic luminescence transistor devices according to other embodiments of the present invention;

FIG. 15 is a schematic circuit diagram showing another example of organic luminescence transistor, including an organic luminescence transistor device according to an embodiment of the present invention provided for each pixel (unit device) in a luminescent display apparatus;

FIG. 16 is a schematic sectional view of an organic luminescence transistor device of an example 1;

FIG. 17 is a schematic sectional view of an organic luminescence transistor device of an example 2;

BEST MODE FOR CARRYING OUT THE INVENTION

The preset invention is explained in detail based on embodiments thereof. FIGS. 1 to 7 show respective embodiments of an organic luminescence transistor device according to the present invention. The organic luminescence transistor device of the present invention is a field effect type of organic luminescence transistor device having an organic EL device structure and a vertical FET structure.

Figure 1:
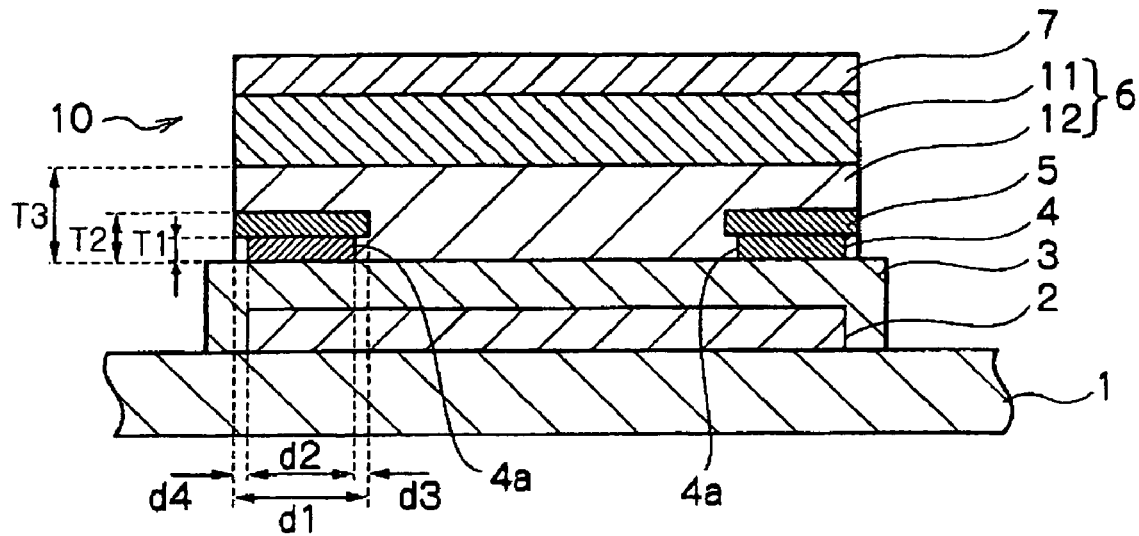
FIG. 1 is a schematic sectional view showing an organic luminescence transistor device according to an embodiment of the present invention.
Figure 20:
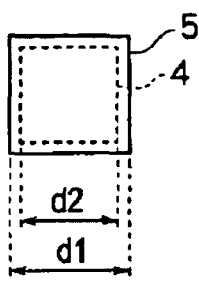
FIG. 20 is a plan view showing part of FIG. 1.

The embodiment shown in FIG. 1 comprises, at least, a substrate 1, an assistance electrode layer 2 provided on an upper surface of the substrate 1, an insulation film 3 provided on an upper surface of the assistance electrode layer 2, a first electrode 4 provided locally on an upper surface of the insulation film 3 so as to cover an area of a predetermined size, an electric-charge-injection inhibiting layer 5 provided on an upper surface of the first electrode 4 such that the electric-charge-injection inhibiting layer 5 has a shape larger than that of the first electrode 4 in a plan view (see FIG. 20), an electric-charge injection layer 12 provided both on the upper surface of the insulation film 3 at an area not provided with the first electrode 4 and on an upper surface of the electric-charge-injection inhibiting layer 5, a luminescent layer 11 provided on an upper surface of the electric-charge injection layer 12, and a second electrode 7 provided on an upper surface of the luminescent layer 11.

Herein, in the present specification, the electric-charge injection layer 12 and the luminescent layer 11 may be integrally called an organic layer 6. If required, an electric-charge transfer layer (described below) may be included in the organic layer 6.

In the embodiment of FIG. 1, the electric-charge injection layer 12 and an edge portion (end surface) 4a of the first electrode 4 are in contact with each other. At the edge portion 4a of the first electrode 4, electric charges (positive holes or electrons) are generated by a gate voltage VG applied between the first electrode 4 and the assistance electrode 2. The electric charges are carried from the first electrode 4 toward the second electrode 7 by a drain voltage VD applied between the first electrode 4 and the second electrode 7.

In the present embodiment (although the other embodiments are also the same), by applying a constant electric field (drain voltage VD) between the first electrode 4 and the second electrode 7 and by varying an electric field (gate voltage VG) applied between the assistance electrode 2 and the first electrode 4, a generation amount of the electric charges can be controlled. The generated electric charges are carried to the luminescent layer 11, and reunite with electric charges supplied from the second electrode 7 so as to be made luminescent (to emit light). Thus, when the generation amount of the electric charges is controlled, an amount of the luminescence is controlled.

Figure 2:
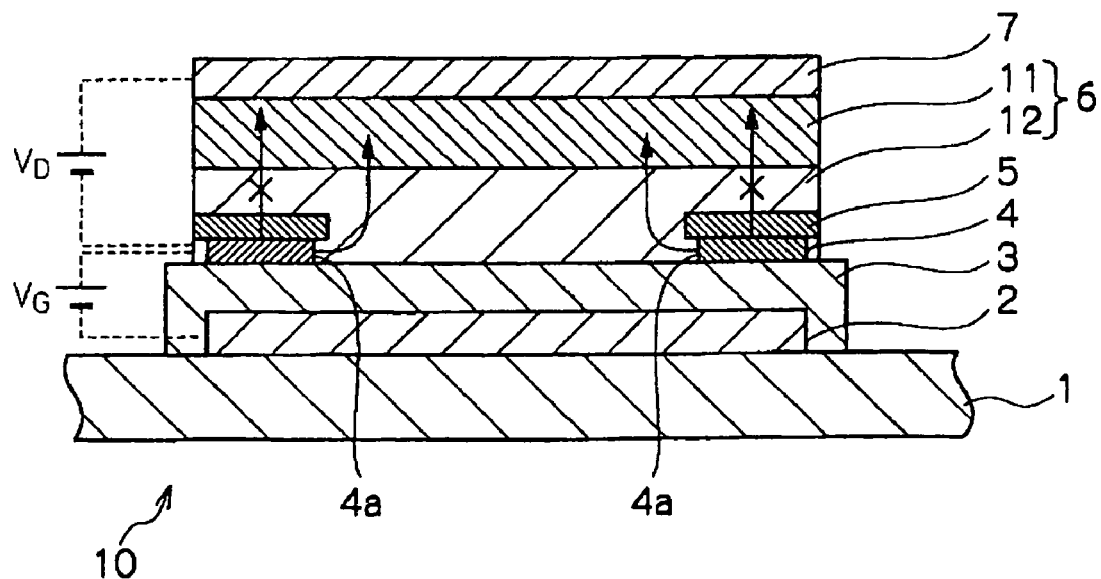
FIG. 2 is an explanatory view conceptually showing flows of electric charges in the organic luminescence transistor device of FIG. 1.

This control for the amount of the luminescence can be achieved by the fact that the electric-charge-injection inhibiting layer 5 is provided on the first electrode 4. As shown in FIG. 2, when a constant voltage (drain voltage VD) is applied between the first electrode 4 and the second electrode 7, a flow toward the second electrode 7 of the electric charges, which are generated on the upper surface of the first electrode 4, is inhibited by the existence of the electric-charge-injection inhibiting layer 5. Only electric charges generated at an edge portion (end surface) 4a, which has only a small area and is not covered by the electric-charge-injection inhibiting layer 5, flow toward the second electrode 7. Thus, under such a situation that the constant voltage (drain voltage VD) is applied between the first electrode 4 and the second electrode 7, the electric current between the first electrode and the second electrode is inhibited. As a result, by controlling the voltage (gate voltage VG) applied between the assistance electrode 2 and the first electrode 4, generation of the electric charges is assisted, so that the amount of the generated electric charges can be controlled and thus the amount of the luminescence can be controlled.

As a feature of the present invention, as shown in FIGS. 1 to 8, the electric-charge-injection inhibiting layer 5 is provided on the first electrode 4 such that the electric-charge-injection inhibiting layer 5 has a shape larger than that of the first electrode 4 in a plan view. Thus, at least partially, the edge portion 4a of the first electrode 4 is located inside an edge portion of the electric-charge-injection inhibiting layer 5. Under such a situation, when a constant voltage is applied between the first electrode 4 and the second electrode 7, generation of the electric charges (positive holes or electrons) on an upper surface and a contour edge of the first electrode 4 can be inhibited. As a result, compared with a case wherein the first electrode 4 and the electric-charge-injection inhibiting layer 5 are formed in the same size (in a plan view), direct effect of the voltage applied between the assistance electrode 2 and the first electrode 4 can be made less.

With reference to FIG. 1, when the width of the electric-charge-injection inhibiting layer 5 is represented by d1; the width of the first electrode 4 is represented by d2, and gaps (non-overlapped width) between the edge portion of the electric-charge-injection inhibiting layer 5 and the edge portion 4a of the first electrode 4 are represented by d3 and d4, it is preferable that d2<d1 and that the edge portion 4a of the first electrode 4 is located inside the edge portion of the electric-charge-injection inhibiting layer 5. The position of the edge portion(s) 4a of the first electrode 4 is determined by the gaps (de, d4) relative to the edge portion(s) of the electric-charge-injection inhibiting layer 5. When the gaps (d3, d4) are very small, that is, when the first electrode 4 and the electric-charge-injection inhibiting layer 5 have substantially the same size in a plan view, generation of the electric charges (positive holes or electrons) may be caused at the contour edge(s) of the edge portion(s) 4a of the first electrode 4. In that case, the thus generated electric charges tend to be affected by the voltage applied between the assistance electrode 2 and the first electrode 4. Therefore, control characteristics of the electric current between the first-second electrodes may be deteriorated to some extent. On the other hand, the gaps (d3, d4) may be considerably large as far as it is not difficult to form such shapes.

Figure 6:
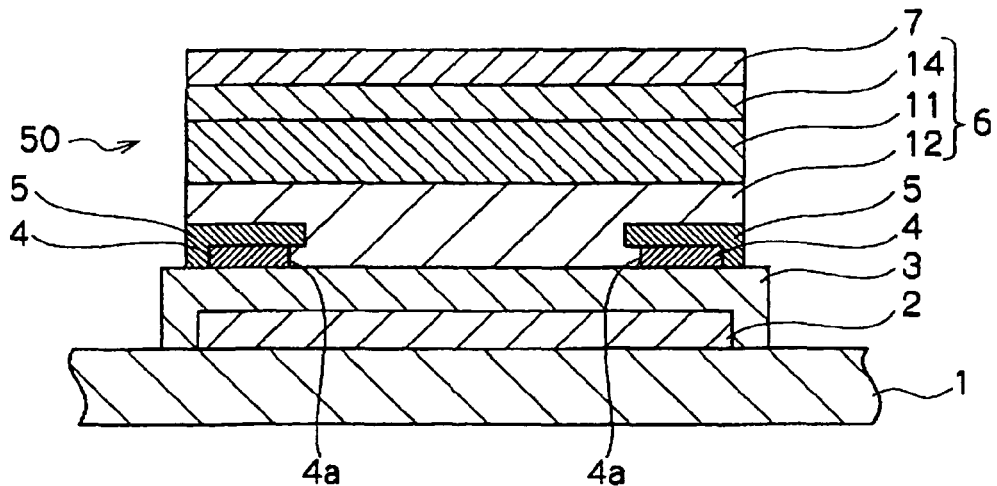
FIG. 6 is a schematic sectional view showing an organic luminescence transistor device according to another embodiment of the present invention.
Figure 7:
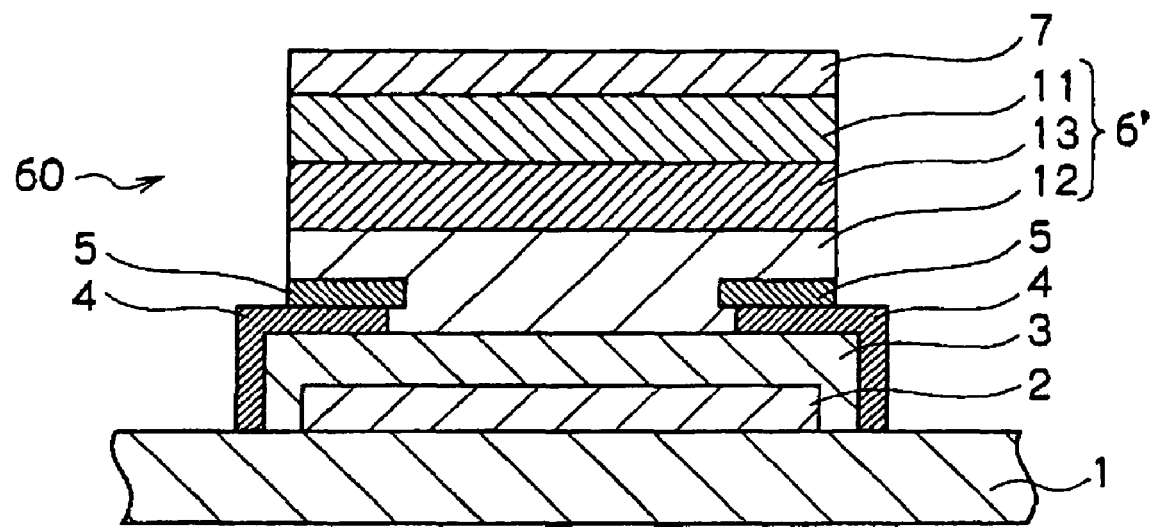
FIG. 7 is a schematic sectional view showing an organic luminescence transistor device according to another embodiment of the present invention.

The forms of the first electrode 4 and the electric-charge-injection inhibiting layer 5 may be as shown in FIGS. 6 and 7. In the embodiments shown in FIGS. 6 and 7, differently from the embodiment shown in FIG. 1, one edge portion 4a of the first electrode 4 is located inside one edge portion of the electric-charge-injection inhibiting layer 5 on the side of the electric-charge injection layer 12 provided between neighbor first electrodes. Regarding the other edge portion of the first electrode 4 on the opposite side, in the embodiment as shown in FIG. 6, the electric-charge-injection inhibiting layer 5 covers the first electrode 4, and in the embodiment as shown in FIG. 7, the first electrode 4 is extended to an upper surface of the insulation film 3 (see an upper end portion or a lower end portion of a comb-shaped electrode shown in FIGS. 11 and 12, for example). Compared therewith, in the embodiment as shown in FIG. 1, both the right and left edge portions 4a of the first electrode 4 are located inside the respective edge portions of the electric-charge-injection inhibiting layer 5. In the embodiment of the FIG. 1, both the right and left edge portions 4a are in contact with the electric-charge injection layer 12 (see a central portion of the comb-shaped electrode shown in FIGS. 11 and 12, for example).

Regarding polarity of the electrodes, the first electrode 4 may be structured as an anode, and the second electrode 7 may be structured as a cathode. Alternatively, the first electrode 4 may be structured as a cathode, and the second electrode 7 may be structured as an anode. Whichever polarity the first electrode 4 and the second electrode 7 have respectively, the amount of the electric charges can be sensitively varied by controlling the voltage applied between the assistance electrode 2 and the first electrode 4. Thus, the electric current between the first and second electrodes can be controlled, so that the amount of the luminescence can be controlled.

Herein, when the first electrode 4 is an anode and the second electrode 7 is a cathode, the electric-charge injection layer adjacent to the first electrode 4 is a positive-hole injection layer. Then, if another electric-charge injection layer 14 (third electric-charge injection layer) adjacent to the second electrode 7 is provided (see FIG. 6), the electric-charge injection layer 14 is an electron injection layer. On the other hand, when the first electrode 4 is a cathode and the second electrode 7 is an anode, the electric-charge injection layer adjacent to the first electrode 4 is an electron injection layer. Then, if another electric-charge injection layer 14 adjacent to the second electrode 7 is provided (see FIG. 6), the electric-charge injection layer 14 is a positive-hole injection layer.

Figure 4:
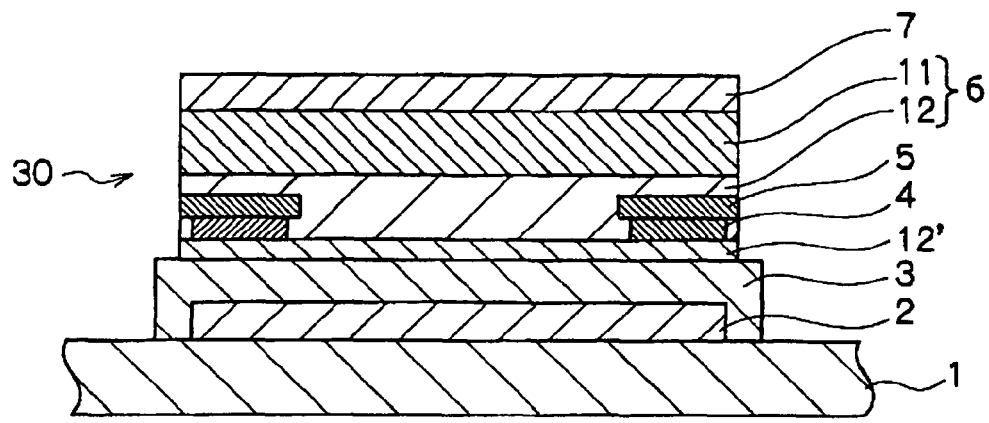
FIG. 4 is a schematic sectional view showing an organic luminescence transistor device according to another embodiment of the present invention.
Figure 5:
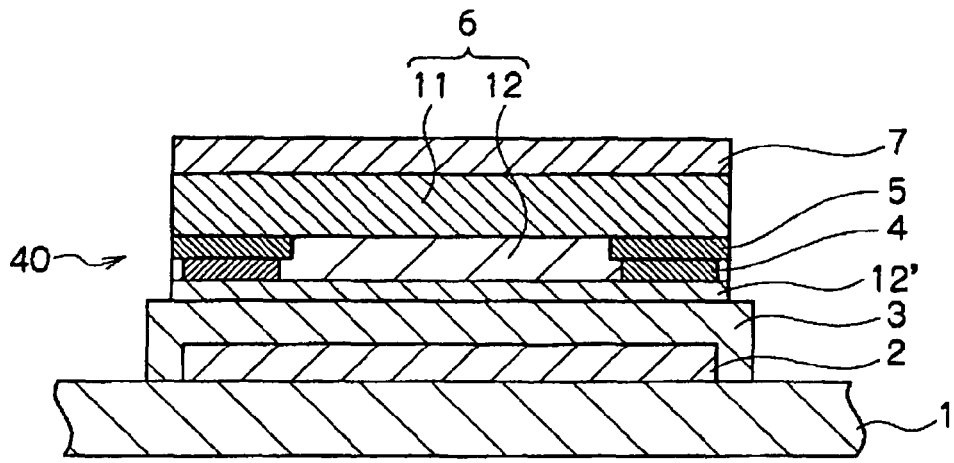
FIG. 5 is a schematic sectional view showing an organic luminescence transistor device according to another embodiment of the present invention.

The important features are that the first electrode 4 is formed on a side of the upper surface of the insulation film 3 (a second electric-charge injection layer may be provided therebetween: see FIG. 5), and that the electric-charge-injection inhibiting layer 5 is formed on the first electrode 4 to have a shape larger than that of the first electrode 4 in a plan view (such that the electric-charge-injection inhibiting layer 5 covers over (at least a part of) the contour edge of the first electrode 4), and that the edge portion 4a of the first electrode 4 is arranged in contact with (adjacent to) the electron-charge injection layer 12. The other features may be variously modified. For example, respective embodiments as shown in FIGS. 3A to 7 may be adopted.

For example, regarding the structural form of the organic layer 6 having the electric-charge injection layer 12 and the luminescent layer 11; (i) as shown in FIG. 1, the electric-charge injection layer 12 may be formed to have a thickness T3 not less than the thickness T1 of the first electrode 4 and also not less than the total thickness T2 of the first electrode 4 and the electric-charge-injection inhibiting layer 5; (ii) as shown in FIG. 3A, the electric-charge injection layer 12 may be formed to have substantially the same thickness as the thickness T1 of the first electrode 4; and (iii) as shown in FIG. 3B, the electric-charge injection layer 12 may be formed to have the substantially the same thickness as the total thickness T2 of the first electrode 4 and the electric-charge-injection inhibiting layer 5. In any of the above embodiments, the edge portion 4a of the first electrode 4 can be come in contact with the electric-charge injection layer 12.

In addition, for example, as shown in FIG. 3C, the electric-charge injection layer 12 may be formed to have substantially the same thickness as the thickness T1 of the first electrode 4, and the luminescent layer 11 may be formed on the electric-charge injection layer 12 to have substantially the same thickness as the thickness of the electric-charge-injection inhibiting layer 5. (As shown in FIG. 3C, the maximum thickness of the luminescent layer can be substantially the same thickness as the thickness of the electric-charge-injection inhibiting layer 5. The thickness of the luminescent layer may be thinner than the thickness of the electric-charge-injection inhibiting layer 5.) In the organic luminescent transistor device 20C according to the embodiment of FIG. 3C as well, the edge portion 4a of the first electrode can be come in contact with the electric-charge injection layer 12. In addition, in the organic luminescent transistor device 20C according to the embodiment of FIG. 3C, the luminescent layer 11 is formed between layered structural bodies 8, each of which consists of the first electrode 4 and the electric-charge-injection inhibiting layer 5, so that an matrix-patterned device can be achieved.

Regarding the layered form of the organic layer 6, for example; as shown in FIGS. 1 to 3C, a two-layer structure wherein the electric-charge injection layer 12 and the luminescent layer 11 are formed on the insulation film 3 in this order may be given as an example; as shown in FIGS. 4 and 5, a three-layer structure wherein the second electric-charge injection layer 12' and the electric-charge injection layer 12 and the luminescent layer 11 are formed on the insulation film 3 in this order may be given as an example; as shown in FIG. 6, a three-layer structure wherein the electric-charge injection layer and the luminescent layer 11 and the electric-charge injection layer 14 are formed ion the insulation film 3 in this order may be given as an example; as shown in FIG. 7, a three-layer structure wherein the electric-charge injection layer 12 and the electric-charge transfer layer 13 and the luminescent layer 11 are formed in this order from the side of the insulation film 3 may be given as an example. The structure of the organic layer 6 is not limited thereto. If required, an electric-charge transfer layer or the like may be provided. In addition, an electric-charge injection layer material and/or an electric-charge transfer layer material may be included in the luminescent layer 11, so that the single layer of the luminescent layer 11 can have functions of the electric-charge injection layer and/or the electric-charge transfer layer.

As described above, in the respective embodiments shown in FIGS. 4 and 5, the electric-charge injection layer 12' and the electric-charge injection layer 12 and the luminescent layer 11 are formed on the insulation film 3 in this order. That is, in the organic luminescence transistor devices 30, 40 according to these embodiments, the electric-charge injection layer 12' made of a material the same as or different from that of the electric-charge injection layer 12 is provided between the insulation film 3 and the first electrode 4 and the electric-charge injection layer 12 shown in FIGS. 1 to 3. In the organic luminescence transistor devices 30, 40, since the electric-charge injection layer 12" is further provided, electric charges may be generated at a surface of the first electrode 4 on the side of the insulation film 3 as well. The generated electric charges are controlled by the voltage applied between the assistance electrode 2 and the first electrode 4. Thus, the electric current between the first and second electrodes is controlled, so that the amount of the luminescence can be controlled.

The organic luminescence transistor devices of the respective embodiments may be top-emission type of luminescence (Light-Emitting) transistor devices or bottom-emission type of luminescence transistor devices. Light transmittance of each layer is designed depending on which type is adopted. Each sectional view of the organic luminescence transistor device corresponds to one pixel of an organic luminescence transistor. Thus, if a luminescent layer is formed to emit a predetermined color light for each pixel, a color display or the like may be formed as a luminescent display apparatus.

Figure 8:
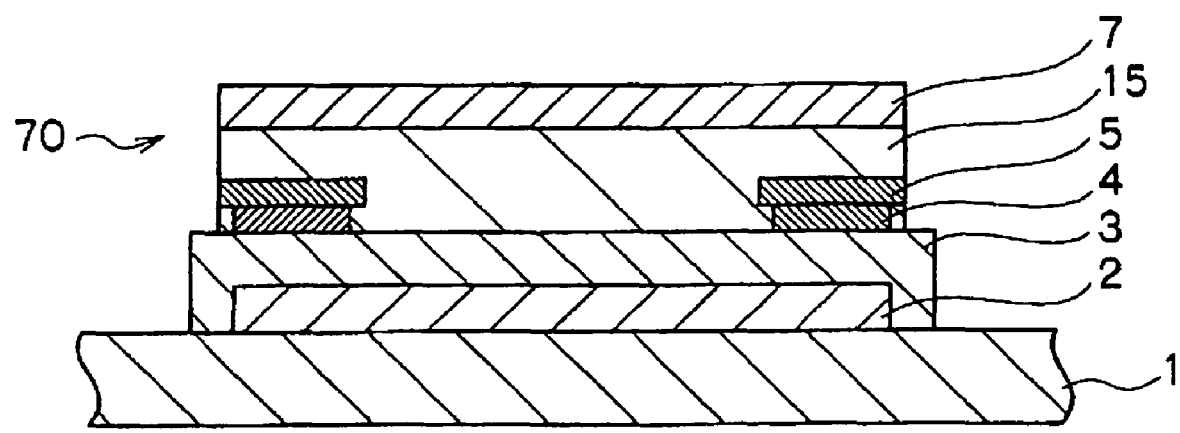
FIG. 8 is a schematic sectional view showing an organic transistor device according to an embodiment of the present invention.

In addition, as shown in FIG. 8, the features of the present invention may be used for an organic transistor device. In the organic transistor device 70 of FIG. 8, the electric-charge-injection inhibiting layer 5 is formed on the first electrode 4 opposite to the second electrode 7, the electric-charge-injection inhibiting layer 5 being larger than the first electrode 4 in a plan view. Thus, the amount of the electric charges flowing toward an organic semiconductor layer (for example, an electric-charge injection layer or an electric-charge transfer layer) can be inhibited (controlled). (Control characteristics of the organic transistor device are improved by the inhibition of the direct flow of the electric charges from the upper surface of the first electrode 4 to the second electrode 7).

<Structure of the Organic Luminescence Transistor Device>

Layers and electrodes included in the organic luminescence transistor devices of the respective embodiments are explained below.

The substrate 1 is not particularly limited, but may be suitably selected depending on materials or the like of layers to be laminated. For example, it may be selected from various materials such as metal, for example aluminum, glass, quartz, or resin. In the case of an organic luminescence transistor device having a bottom-emission structure, which emits light from a side of the substrate, it is preferable that the substrate is formed of a transparent or semitransparent material. On the other hand, in the case of an organic luminescence transistor device having a top-emission structure, which emits light from a side of the second electrode 7, it is not necessary to use a transparent or semitransparent material. That is, the substrate 1 may be formed of an opaque material.

More preferably, it is possible to use various materials that have been generally used as a substrate of an organic EL device. For example, depending on the application, flexible materials or rigid materials or the other may be selected. Specifically, there can be used substrates made from such materials as glass, quartz (silica), polyethylene, polypropylene, polyethylene terephthalate, polymethacrylate, polymethyl methacrylate, polymethyl acrylate, polyester, and polycarbonate.

The substrate 1 may have an individual shape or a continuous shape (a film or a SUS roll (thin SUS roll)). Specifically, a card-patterned shape, a film-like shape, a disk-like shape, and so on may be given as an example.

As electrodes, there are provided the assistance electrode 2, the first electrode 4 and the second electrode 7. As materials for the respective electrodes, a metal, a conductive oxide, a conductive polymer or the like may be used.

The first electrode 4 is locally provided on the side of the upper surface of the insulation film 3 in a predetermined size. The predetermined size is not particularly limited. As an example, there is provided a comb-shaped electrode 4 having a line-width of about 1 to 500 µm and a line-pitch of about 1 to 500 µm, (which is shown as a layered structure 8 in FIG. 11), which is described below with reference to FIG. 11. Alternatively, there may be provided a lattice-shaped electrode 4 having a lattice-width of about 1 to 500 µm and a lattice-pitch of about 1 to 500 µm, (which is shown as layered structures 8x in the X-direction and layered structures 8y in the Y-direction in FIG. 12), which is described below with reference to FIG. 12. The shape of the first electrode 4 is not limited to the comb-like shape or the lattice-like shape, but may be various shapes such as a rhombus or a circle. The line-width and the line-pitch thereof are also not limited particularly. In addition, the line-width and/or the line-pitch may be not uniform.

Examples of materials useful for forming the assistance electrode 2 include electrically-conductive transparent films such as films of ITO (indium tin oxide), indium oxide, IZO (indium zinc oxide), SnO2, and ZnO; metallic materials having great work functions, such as gold and chromium; general metallic materials, such as silver and aluminum; and electrically-conductive polymers such as polyaniline, polyacetylene, polyalkylthiophene derivatives, and polysilane derivatives. The assistance electrode 2 is provided on the side of the upper surface of the substrate 1. A barrier layer and/or a smoothing layer may be provided between the substrate 1 and the assistance layer 2.

Examples of materials useful for forming the first electrode 4 or the second electrode 7 as a cathode include single metallic materials such as aluminum and silver; magnesium alloy, such as MgAg; aluminum alloy, such as AlLi, AlCa, and AlMg; alkali metallic materials, such as Li and Ca; alkali metallic alloy, such as LiF; and other metallic materials having small work functions.

On the other hand, examples of materials useful for forming the first electrode 4 or the second electrode 7 as an anode include, among the electrode-forming materials useful for the auxiliary electrode 2 and for the above-described cathode, metals that produce "ohmic contact" with some material of the organic layer (the charge injection layer or the luminescent layer) in contact with the anode. Preferred examples of such materials include metallic materials having great work functions, such as gold and chromium; electrically-conductive transparent films such as films of ITO (indium tin oxide), indium oxide, IZO (indium zinc oxide), SnO2, and ZnO; and electrically-conductive polymers such as polyaniline, polyacetylene, polyalkylthiophene derivatives, and polysilane derivatives. Each of the assistance electrode 2, the first electrode 4 and the second electrode 7 may be a single-layered electrode made of any of the above materials, or a multi-layered electrode made of a plurality of the above materials. The thickness of each electrode is not limited, but usually within a range of 10 to 1000 nm.

When the organic luminescence transistor device is a bottom-emission type, it is preferable that the electrodes located below the luminescent layer 11 are transparent or semitransparent. On the other hand, when the organic luminescence transistor device is a top-emission type, it is preferable that the electrodes located above the luminescent layer 11 are transparent or semitransparent. As a transparent electrode material, any of the above electrically-conductive transparent films, thin metallic films, and electrically-conductive polymer films may be used. Herein, the "below" and the "above" are defined in a vertical direction in the plane of the drawings.

The above respective electrodes are formed by a vacuum process such as vacuum deposition, sputtering or CVD, or a coating process. The thickness (film thickness) of each electrode depends on the material used for the electrode. For example, it is preferable that the thickness is within a range of about 10 nm to about 1000 nm. Herein, when an electrode is formed on the organic layer such as the luminescent layer 11 and/or the electric-charge injection layer 12, a protecting layer (not shown) may be provided on the organic layer, in order to reduce damage of the organic layer at the formation of the electrode. The protection layer may be provided before the electrode is formed, in a case wherein the electrode is formed on the organic layer by a sputtering method or the like.

For example, a vacuum deposition film or a sputtering film is preferably formed by a semitransparent film made of Au, Ag, Al, or the like, or by an inorganic semiconductor film made of ZnS, ZnSe, or the like, which scarcely gives damage to the organic layer when the film is formed. The thickness of the protection layer is preferably within a range of about 1 to about 500 nm.

The insulating layer 3 is formed on the assistance (auxiliary) electrode 2. The insulating layer 3 can be formed from an inorganic material such as SiO2, SiNx or Al2O3, an organic material such as polychloroprene, polyethylene terephthalate, polyoxymethylene, polyvinyl chloride, polyvinylidene fluoride, cyanoethyl pullulan, polymethyl methacrylate, polyvinyl phenol, polysulfone, polycarbonate or polyimide, or a commercially available resist material that is commonly used in this field. The insulation film 3 may be a single-layered insulation film made of any of the above materials, or a multi-layered insulation film made of a plurality of the above materials.

In particular, in the present invention, in view of manufacturing cost and/or manufacturing easiness, it is preferable to use a resist material commonly used in this field. A predetermined pattern may be formed by a screen printing method, a spin coating method, a cast method, a Czochralski method, a decalcomania method, an ink-jetting method, a photolithography method, or the like. The insulation film 3 made of the above inorganic material may be formed by an existing patterning process such as a CVD. It is preferable that the thickness of the insulation film 3 is thinner. However, if the thickness is too thin, leakage electric current between the assistance electrode 2 and the first electrode 4 tends to become great. Thus, the thickness is usually within a range of about 0.001 μm to 5.0 μm.

When the organic luminescent transistor device is the bottom-emission type, the insulation film 3 is located below the luminescent layer 11. Thus, the insulation film 3 is preferably transparent or semitransparent. On the other hand, when the organic luminescent transistor device is the top-emission type, it is unnecessary that the insulation film 3 is transparent or semitransparent.

The electric-charge-injection inhibiting layer 5 is provided on the first electrode 4, in an area larger than the first electrode 4 (in a shape larger than the first electrode 4 in a plan view), and functions to inhibit the flow of the electric charges (positive holes or electrons) generated at the upper surface of the first electrode 4, which is opposite to the second electrode 7, toward the second electrode 7. In the present invention, the shape of the electric-charge-injection inhibiting layer 5 is larger than the upper surface of the first electrode 4, which is opposite to the second electrode 7. Thus, the electric charges (flow of the electric charges) are mainly generated at the edge portion 4a, which has only a small area and is not covered by the electric-charge-injection inhibiting layer 5. The amount of the generated electric charges (flow of the electric charges) at the edge portion 4a of the first electrode 4 is controlled by the gate voltage VG applied between the assistance electrode 2 and the first electrode 4. In addition, the electric charges (flow of the electric charges) generated at the edge portion 4a moves toward the second electrode 7 by means of the drain voltage VD applied between the first electrode 4 and the second electrode 7. Thus, by controlling the gate voltage VG applied between the assistance electrode 2 and the first electrode 4, the electric current flowing between the first electrode 4 and the second electrode 7 may be controlled. Thus, the luminescence amount may be controlled. The electric-charge-injection inhibiting (suppression) layer 5 can be formed from any of a variety of materials, as long as it can exhibit the above-described effects. Examples of films useful for the electric-charge-injection inhibiting (suppression) layer 5 include inorganic or organic insulating films. For example, the electric-charge-injection inhibiting (suppression) layer 5 may be a film of an inorganic insulating material such as SiO2, SiNx or Al2O3, or of a conventional organic insulating material such as polychloroprene, polyethylene terephthalate, polyoxymethylene, polyvinyl chloride, polyvinylidene fluoride, cyanoethyl pullulan, polymethyl methacrylate, polyvinyl phenol, polysulfone, polycarbonate or polyimide. The electric-charge-injection inhibiting (suppression) layer 5 may be a single-layered electric-charge-injection inhibiting layer made of any of the above materials, or a multi-layered electric-charge-injection inhibiting layer made of a plurality of the above materials. The electric-charge-injection inhibiting layer 5 is formed by a vacuum process such as vacuum deposition, sputtering or CVD, or a coating process. The thickness of the electric-charge-injection inhibiting layer 5 depends on the material used for the electric-charge-injection inhibiting layer 5. For example, it is preferable that the thickness is within a range of about 0.001 μm to about 10 μm.

It is preferable that the electric-charge-injection inhibiting layer 5 is made of an insulation material which is easily available, easily formable, and easily capable of precisely patterning. In particular, it is preferable to use a resist material. The resist film may be a positive type or a negative type. When a resist film is used as a material for the electric-charge-injection inhibiting layer 5, the electric-charge-injection inhibiting layer 5 can be precisely formed in a predetermined size (thickness and shape (area)), which is advantageous.

The electric-charge-injection inhibiting layer 5 is formed, at least partially, on the upper surface of the first electrode 4, which is opposite to the second electrode 7, in a shape larger than the first electrode 4. Herein, the edge portion 4a of the first electrode 4 is arranged in contact with the electric-charge injection layer 12. Since the above electric-charge-injection inhibiting layer 5 is formed, the electric charges (flow of the electric charges) are not generated at the upper surface of the first electrode 4, which is opposite to the second electrode 7. However, the electric charges (flow of the electric charges) are generated at the edge portion 4a of the small area. As a result, by controlling the voltage (gate voltage) applied between the assistance electrode 2 and the first electrode 4, the amount of the generated electric charges (generated positive holes) is sensitively changed. This, the electric current between the first and second electrodes can be controlled, so that the amount of the luminescence can be controlled.

As described above, the organic layer 6 includes, at least, the electric-charge injection layer 12 and the luminescent layer 11. If required, an electric-charge transfer layer or the like may be added. Alternatively, the organic layer 6 may include a luminescent layer 11 including an electric-charge injecting material. As long as these requirements are satisfied, the organic layer 6 is not particularly limited. That is, the above respective manners may be adopted. Each layer as a component of the organic layer 6 is formed in a suitable thickness (for example, within a range of 0.1 nm to 1 μm), depending on a structure of the device and/or a kind of the material. Herein, if the thickness of each layer of the organic layer is too large, a large voltage may be necessary in order to obtain a predetermined light emission, which is inferior in light-emission efficiency. On the other hand, if the thickness of each layer of the organic layer is too small, a pinhole or the like may be generated, which results in insufficient luminance (brightness) when the electric field is applied.

Any material that is commonly used as a luminescent layer in an organic EL device is useful for the luminescent layer 11. For example, a pigment luminescent material, a metal complex luminescent material, a polymer luminescent material, or the like may be used.

Examples of luminescent pigments include cyclopentadiene derivatives, tetraphenyl butadiene derivatives, triphenylamine derivatives, oxadiazole derivatives, pyrazoloquinoline derivatives, distyrylbenzene derivatives, distyrylarylene derivatives, silol derivatives, thiophene cyclic compounds, pyridine cyclic compounds, perinone derivatives, perylene derivatives, oligothiophene derivatives, trifumanylamine derivatives, oxadiazole dimers, and pyrazoline dimers. Examples of luminescent metal complexes include alumiquinolinol complexes, benzoquinolinol beryllium complexes, benzoxazole zinc complexes, benzothiazole zinc complexes, azomethyl zinc complexes, porphyrin zinc complexes, and europium complexes. Other examples of luminescent metal complexes include metal complexes having, as a central metal, such a metal as Al, Zn or Be, or a rare earth metal such as Tb, Eu or Dy, and, as a ligand, oxadiazole, thiadiazole, phenylpyridine, phenylbenzoimidazole, or quinoline structure. Examples of luminescent polymers include polyparaphenylene vinylene derivatives, polythiophene derivatives, polyparaphenylene derivatives, polysilane derivatives, polyacetylene derivatives, polyvinyl carbazole, polyfluorenone derivatives, polyfluorene derivatives and polyquinoxaline derivatives, and copolymers of these derivatives.

Additives such as a dopant may be added to the luminescent layer 11 for the purpose of improving light emission efficiency or of changing emission wavelength. Examples of dopants useful herein include perylene derivatives, coumarin derivatives, rubrene derivatives, quinacridone derivatives, squaleum derivatives, porphyrin derivatives, styryl dyes, tetracene derivatives, pyrazoline derivatives, decacyclene, phenoxazone, quinoxaline derivatives, carbazole derivatives, and fluorene derivatives.

Examples of materials useful for forming the electric-charge injection layer 12 include the compounds enumerated above as examples of luminescent materials. Other materials useful for the electric-charge injection layer 12 include phenylamines, starburst amines, phthalocyanines, polyacenes, oxides such as vanadium oxide, molybdenum oxide, ruthenium oxide and aluminum oxide, and derivatives of amorphous carbon, polyaniline, polythiophene, etc.

In particular, it is preferable that the material used for the electric-charge injection layer 12 is a fluid coat-type material. As the fluid coat-type material, any coat-type material may be used, for example a polymer material, a low-molecular material, a dendrimer or the like. It is preferable that the material can easily reach the edge portion 4a of the first electrode 4 located inside an edge portion of the electric-charge-injection inhibiting layer 5 when the electric-charge injection layer 12 is formed. (As a result, the electric charges generated at the edge portion 4a of the first electrode 4 can be efficiently injected into the electric-charge injection layer 12 which is in contact with the edge portion 4a.)

An electric-charge injection layer 14 for the second electrode (see FIG. 6) may be formed on the luminescent layer 11 side of the second electrode 7. Examples of materials that can be used to form the electric-charge (electron) injection layer 14 when the second electrode 7 serves as a cathode include the compounds described above as examples of luminescent materials for the luminescent layer 11, as well as alkaline metals, halides of alkaline metals, organic complexes having alkaline metals, and so on, such as aluminum, lithium fluoride, strontium, magnesium oxide, magnesium fluoride, strontium fluoride, calcium fluoride, barium fluoride, aluminum oxide, strontium oxide, calcium, polymethyl methacrylate polystyrene sodium sulfonate, lithium, cesium, and cesium fluoride.

Examples of materials that can be used to form the electric-charge (hole) transfer layer 13 (see FIG. 7) when the first electrode 4 serves as an anode include those materials that are commonly used as positive-hole transfer materials, such as phthalocyanine, naphthalocyanine, porphyrin, oxadiazole, triphenylamine, triazole, imidazole, imidazolone, pyrazoline, tetrahydroimidazole, hydrazone, stilbene, pentacene, polythiophene and butadiene, and derivatives of these compounds. It is also possible to use poly(3,4)ethylenedioxythiophene/polystyrene sulfonate (abbreviation: PEDOT/PSS, manufactured by BAYER AG., trade name: Baytron P A14083, sold as an aqueous solution) and the like, commercially available as materials useful for forming the electric-charge transfer layer 13. An electric-charge-transfer-layer-forming coating liquid containing any of the above-enumerated compounds is used to form the electric-charge transfer layer 13. The electric-charge transfer material may be incorporated into the luminescent layer 11 or into the electric-charge injection layer 12.

Further, although not shown in the figures, an electric-charge transfer layer may be formed on the second electrode 7 side of the luminescent layer 11. Examples of materials that can be used to form this electric-charge (electron) transfer layer when the second electrode 7 serves as a cathode include those materials that are commonly used as electron transfer materials, such as anthraquinodimethane, fluorenylidene methane, tetracyanoethylene, fluorenone, diphenoquinone oxadiazole, anthrone, thiopyrane dioxide, diphenoquinone, benzoquinone, marononitrile, dinitrobenzene, nitroanthraquinone, maleic anhydride, and perylene tetracarboxylic acid, and derivatives of these compounds. An electric-charge-transfer-layer-forming coating liquid containing any of the above-enumerated compounds is used to form the electric-charge (electron) transfer layer. The electric-charge transfer material may be incorporated into the luminescent layer 11 or into the charge injection layer 12.

A luminescent material or electric-charge transfer/injection material, such as an oligomeric or dendrimeric material, can be incorporated in the organic layer composed of the luminescent layer 11, the charge injection layer 12, the electric-charge transfer layer 13, etc., as needed. To form each layer constituting the organic layer, a vacuum deposition process is used. Alternatively, a coating liquid prepared by dissolving or dispersing the material for forming each layer in such a solvent as toluene, chloroform, dichloromethane, tetrahydrofuran, or dioxane is applied with an applicator or the like, or is printed, to form each layer.

As described above, the organic layer 6 is formed by the luminescent-layer forming material, the electric-charge-injection-layer forming material, electric-charge-transfer-layer forming material, and/or the like, depending on the respective layered (laminated) manners. Herein, the organic layer 6 is divided by partitions (not shown), and formed at each predetermined position. The partitions (not shown) form areas divided for respective emission colors in the plane of the organic luminescent transistor. As a material for the partitions, any conventional material that is commonly used as a partition material may be used, for example a photosensitive resin, an active energy beam curable resin, a heat curable resin, a thermoplastic resin or the like. As a forming method of the partitions, a suitable method for the adopted partition material is adopted. For example, a thick-film printing method or a patterning method to a photosensitive resin may be used to form the partitions.

In the embodiment shown in FIG. 3C, the electric-charge-injection inhibiting layer 5 is thickened to come in contact with the second electrode 7. In the case, the laminated structure consisting of the first electrode 4 and the electric-charge injection inhibiting layer 5 serves as the partition. In the other embodiments, regarding the laminated structure consisting of the first electrode 4 and the electric-charge injection inhibiting layer 5, the thickness of the electric-charge injection inhibiting layer 5 is formed to be thin, for example as shown in FIG. 3A. Thus, light emitting parts are formed by providing respective color organic EL luminescent layers for the areas surrounded (divided) by the partitions (not shown). In addition, the structure shown in FIG. 3A may be arranged inside an area surrounded by the structure shown in FIG. 3C. In the case, the layered structure 8' of FIG. 3C serves as the partitions, and light emitting parts are formed by providing respective color organic EL luminescent layers for the areas surrounded (divided) by the other partitions (not shown).

<Manufacturing Method of the Organic Luminescence Transistor Device>

Figure 9A:
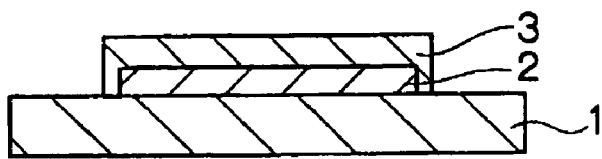
FIGS. 9A to 9F are flow charts showing a manufacturing method of an organic luminescence transistor device according to an embodiment of the present invention.
Figure 9B:
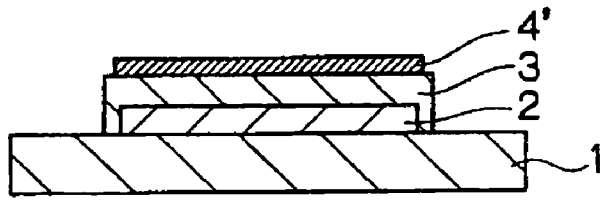
Figure 9C:
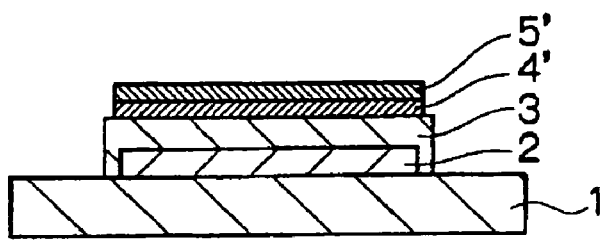
Figure 9D:
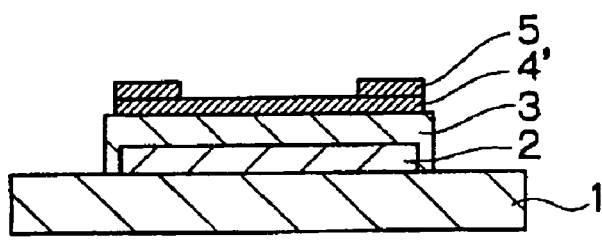
Figure 9E:
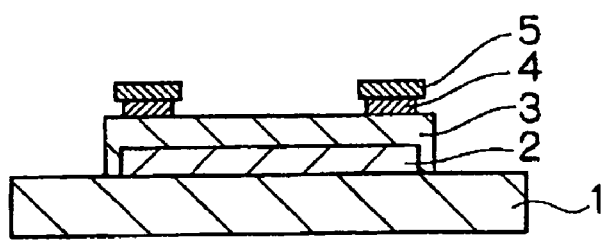
Figure 9F:
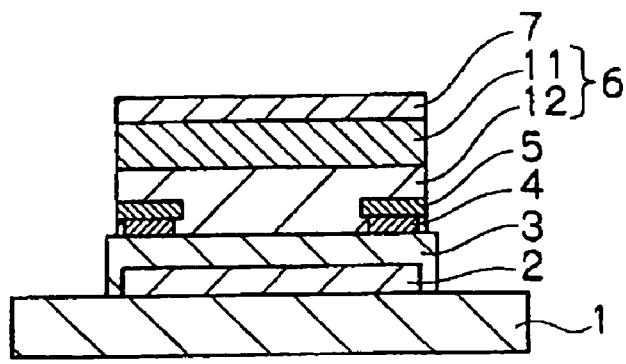
Figure 10A:
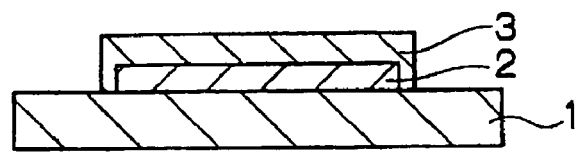
FIGS. 10A to 10F are flow charts showing a manufacturing method of an organic luminescence transistor device according to another embodiment of the present invention.
Figure 10B:
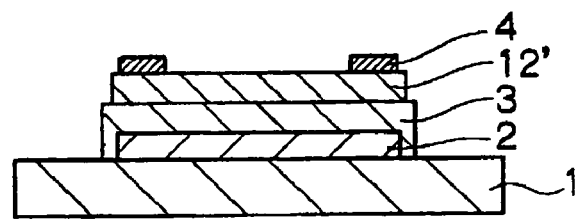
Figure 10C:
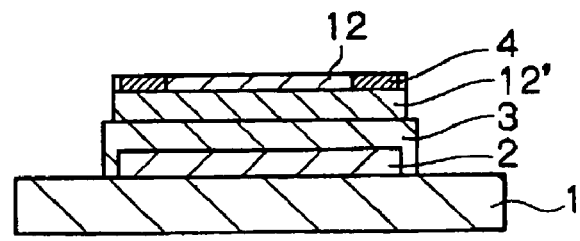
Figure 10D:
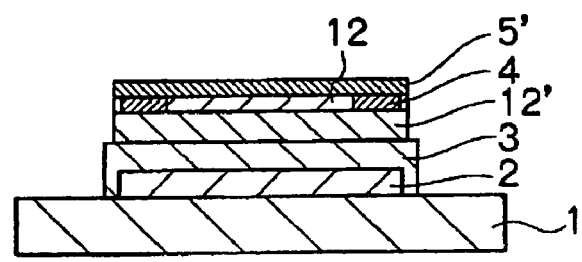
Figure 10E:
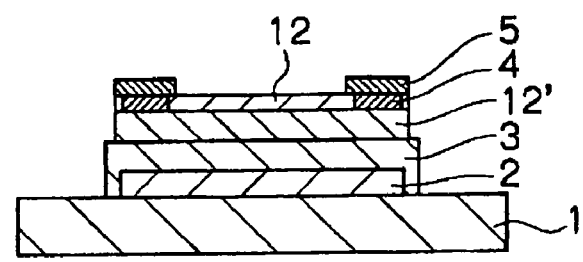
Figure 10F:
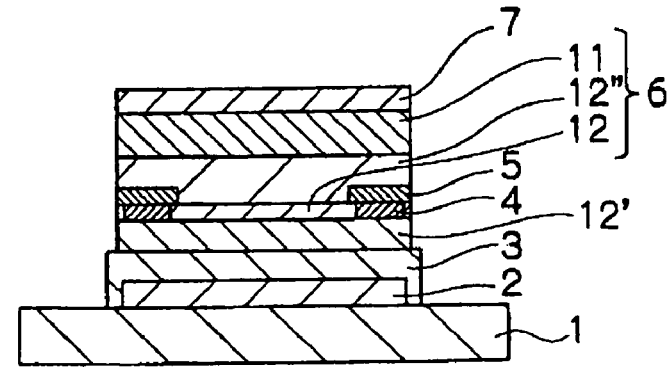

Next, embodiments of a manufacturing method of an organic luminescence transistor device according to the present invention are explained. FIGS. 9A to 9F are flow charts showing a manufacturing method of an organic luminescence transistor device according to an embodiment of the present invention;

The manufacturing method of an organic luminescence transistor device according to the present embodiment comprises, at least, the steps of: preparing a substrate 1 on which an assistance electrode layer 2 and an insulation film 3 has been formed in this order (see FIG. 9A); providing a first electrode 4' locally on the insulation film 3 such that the first electrode 4' covers an area larger than a predetermined size in a plan view (see FIG. 9B); providing an electric-charge-injection inhibiting layer 5 on the first electrode 4' such that the electric-charge-injection inhibiting layer 5 has another predetermined size (a shape larger than the predetermined size of the first electrode 4 in a plan view) (see FIGS. 9C and 9D); etching an edge portion of the first electrode 4' until the edge portion 4a of the first electrode 4 is located inside an edge portion of the electric-charge-injection inhibiting layer 5 such that the first electrode 4 is made into the predetermined size (see FIG. 9E); providing an electric-charge injection layer 12 by coating the upper surface of the insulation film 3 at an area not provided with the first electrode 4 or the electric-charge-injection inhibiting layer 5, with a coat-type electric-charge injection material and providing another electric-charge injection layer 12 on the electric-charge-injection inhibiting layer 5 (see FIG. 9F); providing a luminescent layer 11 on the electric-charge injection layer 12 (see FIG. 9F); and providing a second electrode layer 7 on the luminescent layer 11 (see FIG. 9F).

According to the manufacturing method of the present embodiment, the arrangement of the edge portion 4a of the first electrode 4 inside the edge portion of the electric-charge-injection inhibiting layer 5 is achieved by overetching the laminar first electrode 4' after the electric-charge-injection inhibiting layer 5 of the predetermine size has been formed. Then, the coat-type electric-charge injection material is applied on the insulation film 3 at an area not provided with the first electrode 4, so that the electric-charge injection layer 12 is formed. According to the manufacturing method of the present embodiment, the arrangement of the edge portion 4a of the first electrode 4 inside the edge portion of the electric-charge-injection inhibiting layer 5 (one type of arrangement wherein the electric-charge-injection inhibiting layer 5 is provided on the first electrode 4 in a shape larger than the first electrode 4 in a plan view) can be easily achieved. In particular, it should be noted that the fluid coat-type electric-charge injection material can be easily filled in a space on the insulation film 3 inside the edge portion of the electric-charge-injection inhibiting layer 5.

The coat-type electric-charge injection material can be applied by a coating method such as an ink-jetting method. Thus, compared with a vapor deposition process conducted for a conventional low-molecular electric-charge injection material, the electric-charge injection layer 12 is formed easily and at less cost. In addition, the overetching process of the laminar first electrode 4' may be conducted with an etching liquid or an etching gas corresponding to the material of the first electrode 4.

Among the above steps, in the step of forming the electric-charge-injection inhibiting layer 5 on the first electrode 4' shown in FIG. 9B, as a material for the electric-charge-injection inhibiting layer 5, the various materials as described above may be preferably used. For example, as a material for the electric-charge-injection inhibiting layer 5, a photosensitive resist may be used. In the case, by means of usual exposure, development, and the like, the electric-charge-injection inhibiting layer 5 having the predetermined size can be formed easily and precisely.

FIGS. 9A to 9F correspond to a manufacturing method of an organic luminescence transistor device 10 shown in FIG. 1. However, the organic luminescence transistor devices shown in FIGS. 3A to 3C may be manufactured in the same manner.

When the organic luminescence transistor device 20A shown in FIG. 3A is manufactured, the electric-charge injection layer 12 is formed in such a manner that the thickness T3 of the electric-charge injection layer 12 is not less than the thickness T1 of the first electrode 4 and substantially the same as the thickness T1 of the first electrode 4. Thereafter, the luminescent layer 11 is formed to uniformly cover the upper surface of the electric-charge injection layer 12 and the upper surface of the electric-charge-injection inhibiting layer 5.

When the organic luminescence transistor device 20B shown in FIG. 3B is manufactured, the electric-charge injection layer 12 is formed in such a manner that the thickness T3 of the electric-charge injection layer 12 is substantially the same as the total thickness T2 of the first electrode 4 and the electric-charge-injection inhibiting layer 5. Thereafter, the luminescent layer 11 is formed to uniformly cover the upper surface of the electric-charge injection layer 12 and the upper surface of the electric-charge-injection inhibiting layer 5.

When the organic luminescence transistor device 20C shown in FIG. 3C is manufactured, the electric-charge injection layer 12 is formed in such a manner that the thickness T3 of the electric-charge injection layer 12 is substantially the same as the thickness T1 of the first electrode 4. Thereafter, the luminescent layer 11 is formed in such a manner that the total thickness of the electric-charge injection layer 12 and the luminescent layer 11 doesn't exceed but becomes substantially the same as the total thickness of the first electrode 4 and the electric-charge-injection inhibiting layer 5.

In the manufacturing method for the organic luminescent transistor devices shown in FIGS. 3A to 3C, both the electric-charge injection material and the luminescent-layer forming material may be formed by a coating method such as an ink-jetting method, which is preferable in view of productivity. By means of such a method, the electric-charge injection layer 12 may be formed between adjacent first electrodes 4, 4, to form a device. In addition, as shown in FIG. 3C, luminescent layers 11 may be formed between adjacent layered structures, each of which consists of the first electrode 4 and the electric-charge-injection inhibiting layer 5, to form a matrix-patterned device.

FIGS. 10A to 10F are flow charts showing an example of a manufacturing method of an organic luminescence transistor device shown in FIG. 4. As shown in FIGS. 10A to 10F, the present manufacturing method, at least, comprises the steps of: preparing a substrate 1 on which an assistance electrode layer 2 and an insulation film 3 has been formed in this order (see FIG. 10A); providing a electric-charge-injection layer 12' on the insulation film 3 (see FIG. 10B); providing a first electrode 4 locally on the electric-charge-injection layer 12' on the side of the upper surface of the insulation film 3 such that the first electrode 4 covers an area of a predetermined size (see FIG. 10B); providing an electric-charge injection layer 12 on the insulation film 3 at an area not provided with the first electrode 4 (see FIG. 10C); providing an electric-charge-injection inhibiting layer 5 on the whole upper surface of the first electrode 4 and on end portions of the upper surface of the electric-charge injection layer 12 such that the electric-charge-injection inhibiting layer 5 has a shape larger than that of the first electrode 4 in a plan view (see FIGS. 10D and 10E); providing another electric-charge injection layer 12" on the electric-charge injection layer 12 at an area not provided with the electric-charge-injection inhibiting layer 5 and also on the electric-charge-injection inhibiting layer 5 (see FIG. 10F); providing a luminescent layer 11 on the electric-charge injection layer 12"; and providing a second electrode layer 7 on the luminescent layer 11.

The electric-charge injection layer 12' provided on the insulation film 3 may be made of the same material as the electric-charge injection layer 12 or made of another material different from the electric-charge injection layer 12. The electric-charge injection layer 12" may be also made of the same material as the electric-charge injection layer 12 or made of another material different from the electric-charge injection layer 12. The single electric-charge injection layer is usually made of one single material, but may be made of a lamination of a plurality of materials.

According to the manufacturing method shown in FIGS. 10A to 10F, the arrangement of the edge portion 4a of the first electrode 4 inside the edge portion of the electric-charge-injection inhibiting layer 5 is achieved by providing an electric-charge injection layer 12 between the first electrodes 4 formed into the predetermined size, and by providing an electric-charge-injection inhibiting layer 5 on the first electrode 4 and on the end portions of the electric-charge injection layer 12 such that the electric-charge-injection inhibiting layer 5 has a shape larger than that of the first electrode 4 in a plan view. Herein, in the manufacturing method shown in FIGS. 10A to 10F as well, it is preferable that the electric-charge injection material is a fluid coat-type material.

Organic luminescent transistor devices shown in FIGS. 5 to 7 and an organic transistor device shown in FIG. 8 may be also manufactured through substantially the same steps as the above steps.

<Organic Luminescence Transistor and Luminescence Display Apparatus>

Next, embodiments of an organic luminescence transistor and a luminescence display apparatus are explained. The present invention is not limited by the following explanation.

In the organic luminescence transistor of the present embodiment, a plurality of organic luminescence transistor devices is arranged in a matrix pattern on a sheet-like substrate. The organic luminescence transistor of the present embodiment comprises: the plurality of organic luminescence transistor devices, a first voltage-feeding unit config-ured to apply a constant voltage (drain voltage VD) between the first electrode 4 and the second electrode 7 of each organic luminescence transistor device, and a second voltage-feeding unit configured to apply a variable voltage (gate voltage VG) between the first electrode 4 and the assistance electrode 2 of each organic luminescence transistor device.

Figure 11:
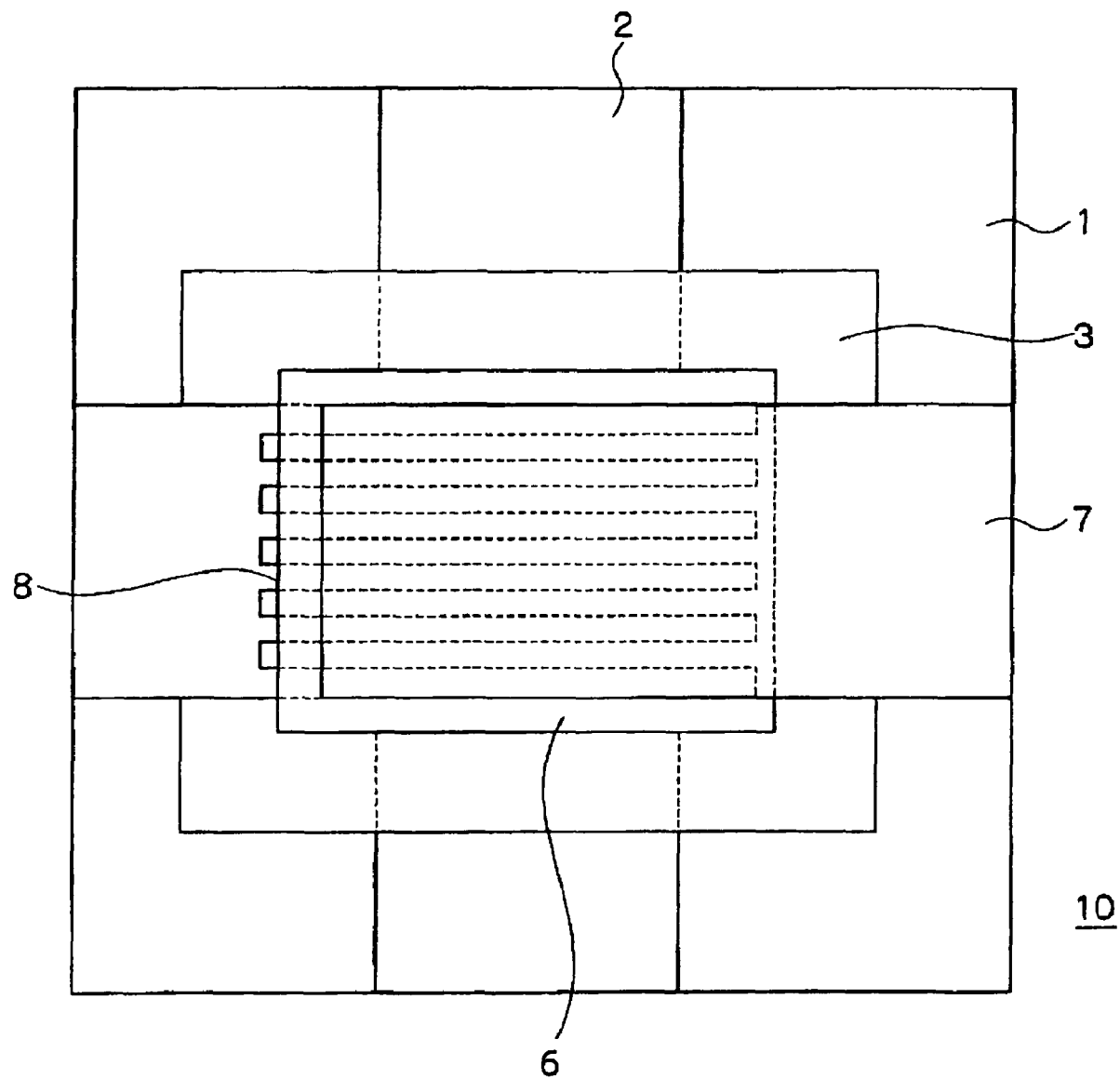
FIG. 11 is a plan view showing an example of electrode arrangement that forms an organic luminescence transistor device according to an embodiment of the present invention.
Figure 12:
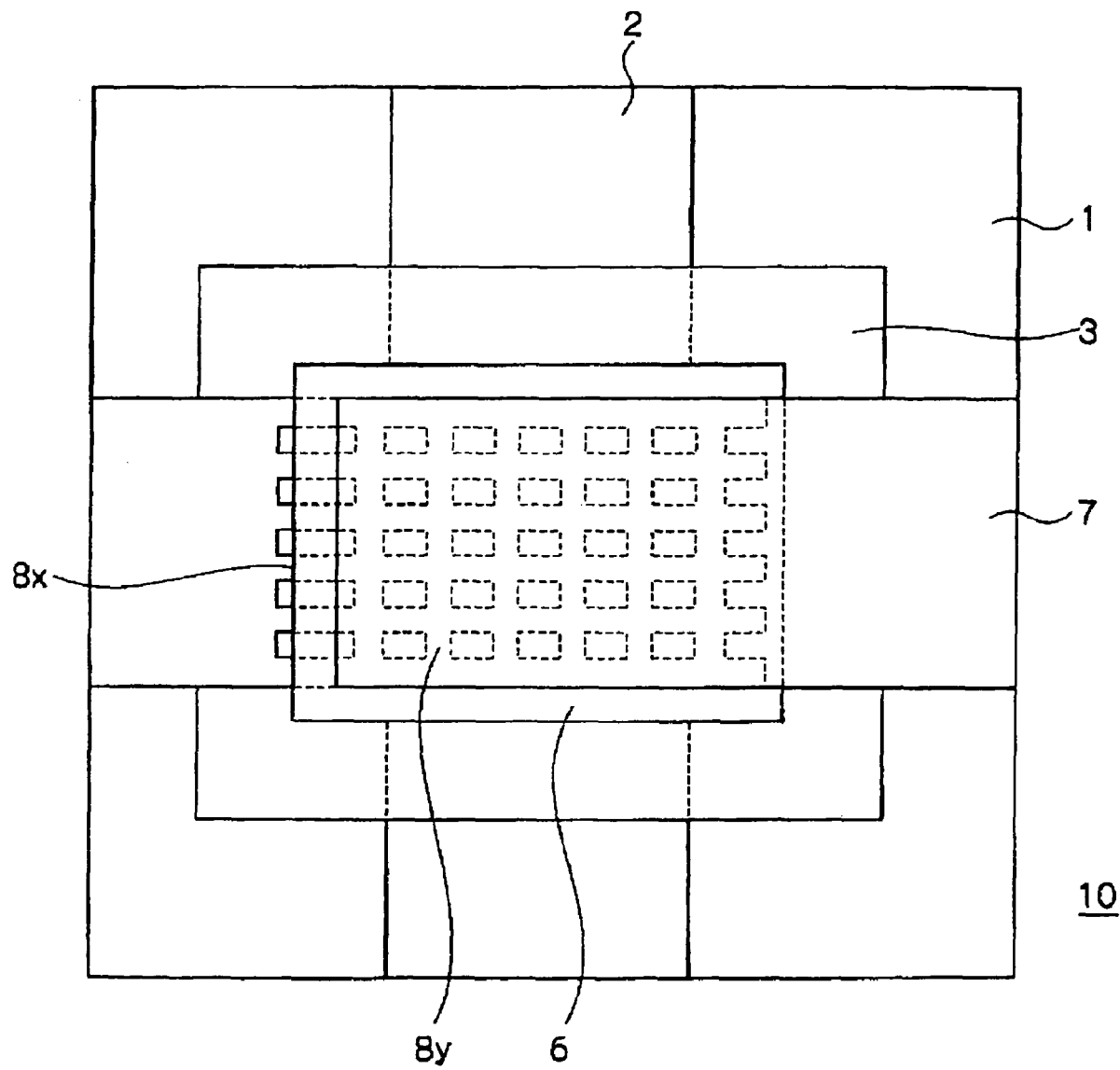
FIG. 12 is a plan view showing another example of electrode arrangement that forms an organic luminescence transistor device according to an embodiment of the present invention.

FIGS. 11 and 12 are plan view showing examples of electrode arrangement of the organic luminescence transistor device included in the organic luminescence transistor of the present embodiment. FIG. 11 is an arrangement view wherein the layered structure 8, which consists of the first electrode 4 and the electric-charge-injection inhibiting layer 5, is formed in a comb-like shape. FIG. 12 is an arrangement view wherein the layered structure is formed in a lattice-like shape. The electrode arrangement shown in FIG. 11 includes an assistance electrode 2 extending in a vertical direction in a plan view; the layered structure 8 (first electrode 4) having a comb-like shape extending transversally from one lateral side perpendicularly to the assistance electrode 2; and a second electrode 7 extending transversally from the other lateral side perpendicularly to the assistance electrode 2 and overlappedly with the layered structure 8. In the electrode arrangement shown in FIG. 12, instead of the layered structure 8 of the comb-like shape shown in FIG. 11, layered structures 8x extending in an X-direction and layered structures 8y extending in a Y-direction are provided, which forms a lattice pattern. Herein, the arrangements shown in FIGS. 11 and 12 are mere examples.

In the luminescence display apparatus of the present embodiment, a plurality of luminescent parts is arranged in a matrix pattern. Each of the plurality of luminescent parts has an organic luminescence transistor device having the feature of the present invention.

Figure 13:
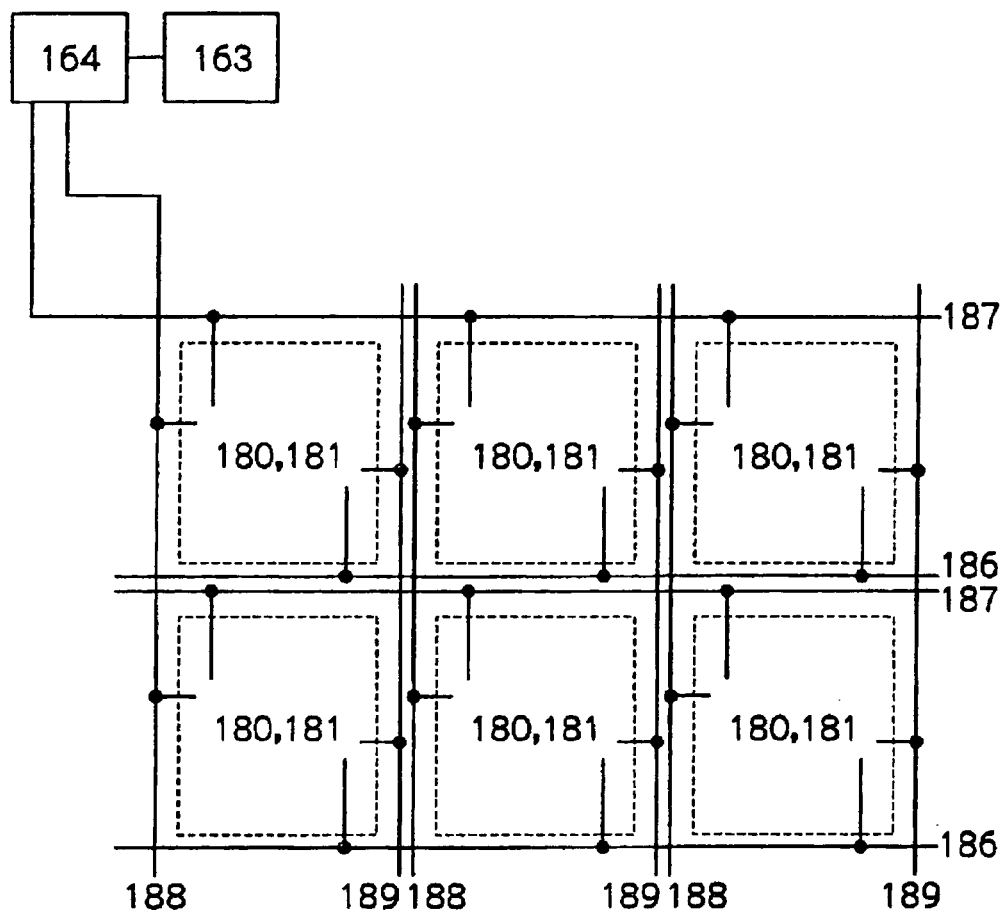
FIG. 13 is a schematic view showing an example of luminescent display apparatus in which an organic luminescence transistor device according to an embodiment of the present invention is embedded.
Figure 14:
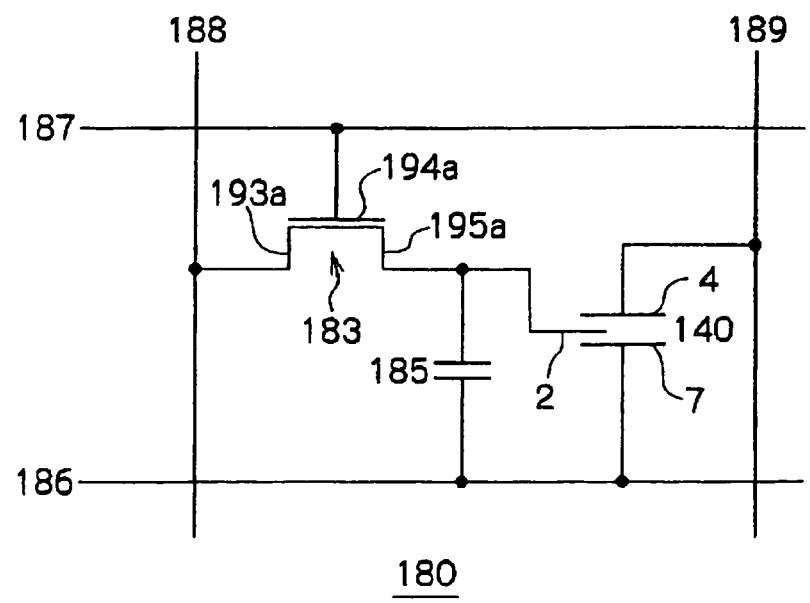
FIG. 14 is a schematic circuit diagram showing an example of organic luminescence transistor, including an organic luminescence transistor device according to an embodiment of the present invention provided for each pixel (unit device) in a luminescent display apparatus.
Figure 18:
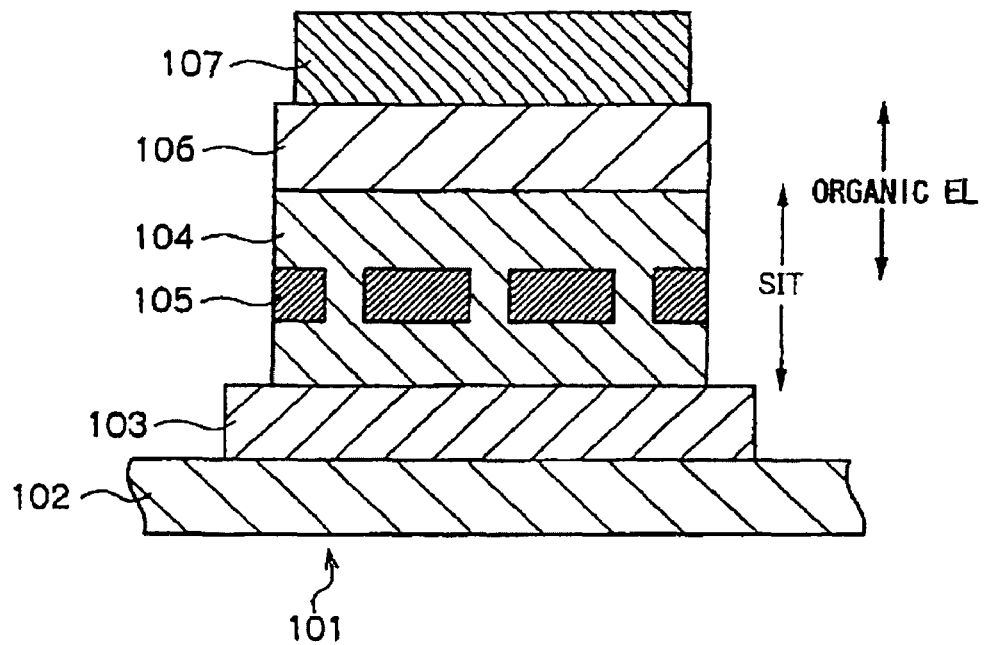
FIG. 18 is a schematic sectional view showing an example of conventional organic luminescence transistor composed of an SIT structure and an organic EL (electroluminescence) device structure.
Figure 19:
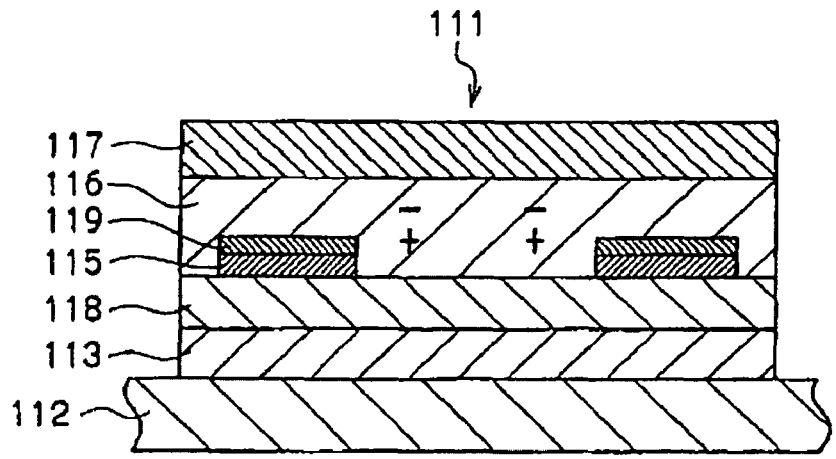
FIG. 19 is a schematic sectional view showing another example of conventional organic luminescence transistor composed of an SIT structure and an organic EL (electroluminescence) device structure.

FIG. 13 is a schematic view showing an example of luminescent display apparatus in which an organic luminescence transistor device according to an embodiment of the present invention is embedded. FIG. 14 is a schematic circuit diagram showing an example of organic luminescence transistor, including an organic luminescence transistor device according to an embodiment of the present invention provided for each pixel (unit device) in a luminescent display apparatus. The luminescent display apparatus explained here is an example wherein each pixel (unit device) 180 has one switching transistor.

Each pixel 180 shown in FIGS. 13 and 14 is connected to a first switching wire 187 and a second switching wire 188, which are arranged crisscross. As shown in FIG. 13, the first switching wire 187 and the second switching wire 188 are connected to a voltage control circuit 164. The voltage control circuit 164 is connected to an image-signal feeding source 163. In addition, in FIGS. 13 and 14, the reference numeral 186 represents a ground wire, and the reference numeral 189 represents a constant-voltage applying wire.

As shown in FIG. 14, the source 193a of a first switching transistor 183 is connected to the second switching wire 188, the gate 194a of the first switching transistor 183 is connected to the first switching wire 187, and the drain 195a of the first switching transistor 183 is connected to the assistance electrode 2 of the organic luminescence transistor 140 and one terminal of a capacitor 185 for maintaining a voltage. The other terminal of the capacitor 185 for maintaining a voltage is connected to the ground 186. The second electrode 7 of the organic luminescence transistor 140 is also connected to the ground 186. The first electrode 4 of the organic luminescence transistor 140 is connected to the constant-voltage applying wire 189.

Next, an operation of the circuit shown in FIG. 14 is explained. When a voltage is applied to the first switching wire 187, the voltage is applied to the gate 194a of the first switching transistor 183. Thus, the source 193 and the drain 195a are electrically connected. Under the situation, when a voltage is applied to the second switching wire 188, the voltage is applied to the drain 195a, so that electric charges are stored in the capacitor 185 for maintaining a voltage. Thus, even when the voltage applied to the first switching wire 187 or the second switching wire 188 is turned off, a certain voltage continues to be applied to the assistance electrode 2 of the organic luminescence transistor 140 until the electric charges stored in the capacitor 185 disappear. On the other hand, when a voltage is applied to the first electrode 4 of the organic luminescence transistor 140, the first electrode 4 and the second electrode 7 are electrically connected, so that an electric current flows from the constant-voltage feeding wire 189 to the ground 186 through the organic luminescence transistor 140. Thus, the organic luminescence transistor 140 becomes luminescent (emits light).

FIG. 15 is a schematic circuit diagram showing another example of organic luminescence transistor, including an organic luminescence transistor device according to an embodiment of the present invention provided for each pixel (unit device) in a luminescent display apparatus. The luminescent display apparatus explained here is an example wherein each pixel (unit device) 181 has two switching transistors.

In the same manner as the case shown in FIG. 14, each pixel 181 shown in FIG. 15 is connected to a first switching wire 187 and a second switching wire 188, which are arranged crisscross. As shown in FIG. 13, the first switching wire 187 and the second switching wire 188 are connected to a voltage control circuit 164. The voltage control circuit 164 is connected to an image-signal feeding source 163. In addition, in FIG. 15, the reference numeral 186 represents a ground wire, the reference numeral 209 represents an electric-current feeding wire, and the reference numeral 189 represents a constant-voltage applying wire.

As shown in FIG. 15, the source 193a of a first switching transistor 183 is connected to the second switching wire 188, the gate 194a of the first switching transistor 183 is connected to the first switching wire 187, and the drain 195a of the first switching transistor 183 is connected to the gate 194b of a second switching transistor 184 and one terminal of a capacitor 185 for maintaining a voltage. The other terminal of the capacitor 185 for maintaining a voltage is connected to the ground 186. The source 193b of the second switching transistor 184 is connected to the electric-current source 209, and the drain 195b of the second switching transistor 184 is connected to the assistance electrode 2 of the organic luminescence transistor 140. The second electrode 7 of the organic luminescence transistor 140 is connected to the ground 186. The first electrode 4 of the organic luminescence transistor 140 is connected to the constant-voltage applying wire 189.

Next, an operation of the circuit shown in FIG. 15 is explained. When a voltage is applied to the first switching wire 187, the voltage is applied to the gate 194a of the first switching transistor 183. Thus, the source 193 and the drain 195a are electrically connected. Under the situation, when a voltage is applied to the second switching wire 188, the voltage is applied to the drain 195a, so that electric charges are stored in the capacitor 185 for maintaining a voltage. Thus, even when the voltage applied to the first switching wire 187 or the second switching wire 188 is turned off, a certain voltage continues to be applied to the gate 194b of the second switching transistor 184 until the electric charges stored in the capacitor 185 disappear. Since the voltage is applied to the gate 194b of the second transistor 184, the source 193b and the drain 195b are electrically connected. Thus, an electric current flows from the constant-voltage feeding wire 189 to the ground 186 through the organic luminescence transistor 140. Thus, the organic luminescence transistor 140 becomes luminescent (emits light).

The image-signal feeding source 163 shown in FIG. 13 includes or is connected to a playback apparatus for the image information or an apparatus of converting inputted electro-magnetic information into an electric signal. The playback apparatus for the image information includes or is connected to an image-information media in which image information is recorded. The image-signal feeding source 163 is configured to convert an electrical signal, which has been sent from the playback apparatus for the image information or from the apparatus of converting inputted electro-magnetic information into an electric signal, into an electric signal manner that is receivable by the voltage control apparatus 164. The voltage control apparatus 164 further converts the electric signal from the image-signal feeding source 163, calculates which pixel 180, 181 should become luminescent and how long the pixel should become luminescent, and then determines the voltage applied to the first switching wire 187 and the second switching wire 188, the time period of application of the voltage and the timing thereof. Thus, the luminescent display apparatus can display a desired image based on the image information.

A color-image display apparatus can be obtained when adjacent small pixels respectively emit RGB three colors, that is, a red-based color, a green-based color and a blue-based color.

EXAMPLES

Examples are explained below.

Example 1

An insulation film 3 was formed of a PVP-based resist (manufactured by TOKYO OHKA KOGYO CO. Ltd., trade name: TMR-P10), into a 300 nm thickness, by means of a spin coating method, on a glass substrate 1 having an assistance electrode 2 that is made of an ITO film and has a 100 nm thickness.

Next, by means of a vacuum deposition method, a first electrode 4 (anode) was uniformly formed of Au (whose thickness was 30 nm). Then, the same PVP-based resist (manufactured by TOKYO OHKA KOGYO CO., Ltd., trade name: TMR-P10) was coated with (applied) by the spin coating method. Through exposure and development with a mask, an electric-charge (positive hole) injection inhibiting layer 5 having a width d1 of 50 μm and a thickness of 100 nm was formed. Then, an Au etching liquid (manufactured by KANTO CHEMICAL CO., INC., trade name: AURUM 101) was used as an etching liquid, so that the first electrode 4 was over-etched such that the edge portion 4a of the first electrode 4 is located inside the edge portion of the electric-charge-injection inhibiting layer 5. Then, the width d2 of the first electrode 4 was 44 μm, d3 and d4 shown in FIG. 2 were 3 μm.

Thereafter, a poly(3-hexylthiophene) (manufactured by ALDRICH Corp., trade name: Poly(3-hexylthiophene-2,5-diyl)), which is an electric-charge injection material, was coated with (applied) on the insulation film 3 at an area not provided with the first electrode 4, by an ink-jetting method. Thus, an electric-charge injection layer 12 having a thickness of 150 nm, which is not less than the total thickness of the first electrode 4 and the electric-charge injection inhibiting layer 5, was formed.

Then, α-NPD (40 nm in thickness) was deposited as an electric-charge (positive hole) transfer layer 13, by means of a vacuum deposition method, so as to cover the electric-charge injection layer 12 and the electric-charge-injection inhibiting layer 5. Furthermore, Alq3 (60 nm in thickness) as a luminescent layer 11/Lif (1 nm in thickness) as an electron injection layer 14/Al (100 nm in thickness) as a second electrode 7 were layered (laminated) in this order by means of a vacuum deposition method. Thus, an organic luminescent transistor device of the example 1 as shown in FIG. 16 was manufactured.

Example 2

Before the laminar first electrode 4 is uniformly formed on the insulation film 3, pentacene (50 nm in thickness) was deposited as the electron-charge (positive hole) injection layer 12', by means of a vacuum deposition method. Except this matter, in the same manner as the example 1, an organic luminescent transistor device of the example 2 as shown in FIG. 17 was manufactured.

Example 3

An insulation film 3 was formed of a PVP-based resist (manufactured by TOKYO OHKA KOGYO CO. Ltd., trade name: TMR-P10), into a 300 nm thickness, by means of a spin coating method, on a glass substrate 1 having an assistance electrode 2 that is made of an ITO film and has a 100 nm thickness.

Next, by means of a vacuum deposition method with a mask, a first electrode 4 (anode) having a width d1=100 μm was formed of Au (whose thickness was 30 nm). Then, a poly(3-hexylthiophene) (manufactured by ALDRICH Corp., trade name: Poly(3-hexylthiophene-2,5-diyl)), which is an electric-charge injection polymer material, was coated with (applied) on the insulation film 3 at an area not provided with the first electrode 4. Thus, an electric-charge injection layer 12 having a thickness of 30 nm, which is the same as the first electrode 4, was formed. Then, on the first electrode 4 and the electric-charge injection layer 12, the same PVP-based resist (manufactured by TOKYO OHKA KOGYO CO. Ltd., trade name: TMR-P10) was deposited by a spin coating method. Then, through exposure and development with a mask, an electric-charge (positive hole) injection inhibiting layer 5 having a width d1 of 120 μm and a thickness of 50 nm was formed. At that time, d3 and d4 shown in FIG. 2 were 10 μm. Thereafter, the same electric-charge injection polymer material was applied more, so that the thickness of the electric-charge injection layer 12 was increased to 100 nm.

Then, α-NPD (40 nm in thickness) was deposited as an electric-charge (positive hole) transfer layer 13, by means of a vacuum deposition method, so as to cover the electric-charge injection layer 12 and the electric-charge-injection inhibiting layer 5. Furthermore, Alq3 (60 nm in thickness) as a luminescent layer 11/Lif (1 nm in thickness) as an electron injection layer 14/Al (100 nm in thickness) as a second electrode 7 were layered (laminated) in this order by means of a vacuum deposition method. Thus, an organic luminescent transistor device of the example 3 was manufactured. The sectional structure of the example 3 is similar to the sectional structure of the example 1 shown in FIG. 16.

Example 4

Before the laminar first electrode 4 is uniformly formed on the insulation film 3, pentacene (50 nm in thickness) was deposited as the electron-charge (positive hole) injection layer 12', by means of a vacuum deposition method. Except this matter, in the same manner as the example 3, an organic luminescent transistor device of the example 4 was manufactured. The sectional structure of the example 4 is similar to the sectional structure of the example 2 shown in FIG. 17.

Example 5

An insulation film 3 was formed of a PVP-based resist (manufactured by TOKYO OHKA KOGYO CO. Ltd., trade name: TMR-P10), into a 300 nm thickness, by means of a spin coating method, on a glass substrate 1 having an assistance electrode 2 that is made of an ITO film and has a 100 nm thickness.

Next, by means of a vacuum deposition method, a first electrode 4 (anode) was uniformly formed of Au (whose thickness was 30 nm). Then, the same PVP-based resist (manufactured by TOKYO OHKA KOGYO CO., Ltd., trade name: TMR-P10) was coated with (applied) by the spin coating method. Through exposure and development with a mask, an electric-charge (positive hole) injection inhibiting layer 5 having a width d1 of 50 μm and a thickness of 100 nm was formed. Then, an Au etching liquid (manufactured by KANTO CHEMICAL CO., INC., trade name: AURUM 101) was used as an etching liquid, so that the first electrode 4 was over-etched such that the edge portion 4a of the first electrode 4 is located inside the edge portion of the electric-charge-injection inhibiting layer 5. Then, the width d2 of the first electrode 4 was 44 μm, d3 and d4 shown in FIG. 2 were 3 μm.

Thereafter, a poly(3-hexylthiophene) (manufactured by ALDRICH Corp., trade name: Poly(3-hexylthiophene-2,5-diyl)), which is an organic semiconductor material, was coated with (applied) on the insulation film 3 at an area not provided with the first electrode 4. Thus, an organic semiconductor layer 15 having a thickness of 150 nm, which is not less than the total thickness of the first electrode 4 and the electric-charge injection inhibiting layer 5, was formed.

Then, Al (70 nm in thickness) was deposited as a second electrode 7 by means of a vacuum deposition method, so that an organic transistor device of the example 5 was manufactured. The sectional structure of the example 5 is similar to the sectional structure shown in FIG. 8.

The invention claimed is:
1. An organic luminescence transistor device comprising
a substrate,
an assistance electrode layer provided on a side of an upper surface of the substrate,
an insulation film provided on a side of an upper surface of the assistance electrode layer,
a first electrode provided locally on a side of an upper surface of the insulation film, the first electrode covering an area of a predetermined size,
an electric-charge-injection inhibiting layer provided on an upper surface of the first electrode, the electric-charge-injection inhibiting layer having a shape larger than that of the first electrode in a plan view, the electric-charge-injection inhibiting layer being made of a material that inhibits both holes and electrons from being transported therethrough,
an electric-charge injection layer provided on the side of an upper surface of the insulation film at an area not provided with the first electrode or the electric-charge-injection inhibiting layer,
a luminescent layer provided on an upper surface of the electric-charge-injection inhibiting layer and on an upper surface of the electric-charge injection layer, and a second electrode layer provided on a side of an upper surface of the luminescent layer.

2. An organic luminescence transistor device according to claim 1, wherein
a thickness of the electric-charge injection layer is greater than a thickness of the first electrode.

3. An organic luminescence transistor device according to claim 1, wherein
the electric-charge injection layer is made of a coat-type electric-charge injection material.

4. An organic luminescence transistor device according to claim 1, wherein
a second electric-charge injection layer made of the same material as or a different material from the electric-charge injection material is provided between the insulation film and the first electrode and the electric-charge injection material.

5. An organic luminescence transistor device according to claim 1, wherein
a third electric-charge injection layer for the second electrode layer is provided between the luminescent layer and the second electrode layer.

6. An organic luminescence transistor device according to claim 1, wherein
an electric-charge transfer layer is provided between the luminescent layer and the third electric-charge injection layer.

7. An organic luminescence transistor device according to claim 1, wherein
the electric-charge-injection inhibiting layer is made of an insulation material.

8. An organic luminescence transistor device according to claim 1, wherein
the first electrode functions as an anode, and the second electrode functions as a cathode.

9. An organic luminescence transistor device according to claim 1, wherein
the first electrode functions as a cathode, and the second electrode functions as an anode.

10. An organic luminescence transistor comprising
an organic luminescence transistor device according to claim 1,
a first voltage-feeding unit configured to apply a constant voltage between the first electrode and the second electrode of the organic luminescence transistor device, and
a second voltage-feeding unit configured to apply a variable voltage between the first electrode and the assistance electrode of the organic luminescence transistor device.

11. A luminescence display apparatus comprising a plurality of luminescent parts arranged in a matrix pattern, wherein
each of the plurality of luminescent parts has an organic luminescence transistor device according to claim 1.

12. A manufacturing method of an organic luminescence transistor device, the manufacturing method being for manufacturing an organic luminescence transistor device according to claim 1, the manufacturing method comprising the steps of:
preparing a substrate on which an assistance electrode layer and an insulation film has been formed in this order,
providing a first electrode locally on a side of an upper surface of the insulation film such that the first electrode covers an area larger than a predetermined size in a plan view,
providing an electric-charge-injection inhibiting layer on an upper surface of the first electrode such that the electric-charge-injection inhibiting layer has a shape larger than the predetermined size of the first electrode in a plan view,
etching an edge portion of the first electrode until the edge portion of the first electrode is located inside an edge portion of the electric-charge-injection inhibiting layer such that the first electrode is made into the predetermined size,
providing an electric-charge injection layer by coating the upper surface of the insulation film at an area not provided with the first electrode or the electric-charge-injection inhibiting layer, with a coat-type electric-charge injection material, after the step of etching,
providing a luminescent layer on an upper surface of the electric-charge-injection inhibiting layer and on an upper surface of the electric-charge injection layer, and
providing a second electrode layer on a side of an upper surface of the luminescent layer.

13. A manufacturing method of an organic luminescence transistor device, the manufacturing method being for manufacturing an organic luminescence transistor device according to claim 1, the manufacturing method comprising the steps of:
preparing a substrate on which an assistance electrode layer and an insulation film has been formed in this order,
providing a first electrode locally on a side of an upper surface of the insulation film such that the first electrode covers an area of a predetermined size,
providing an electric-charge injection layer on the side of an upper surface of the insulation film at an area not provided with the first electrode,
providing an electric-charge-injection inhibiting layer on the whole upper surface of the first electrode and on a partial upper surface of the electric-charge injection layer such that the electric-charge-injection inhibiting layer has a shape larger than that of the first electrode in a plan view,
providing another electric-charge injection layer on the upper surface of the electric-charge injection layer at an area not provided with the electric-charge-injection inhibiting layer,
providing another electric-charge injection layer on an upper surface of the electric-charge-injection inhibiting layer,
providing a luminescent layer on an upper surface of the electric-charge-injection inhibiting layer and on an upper surface of the electric-charge injection layer, and
providing a second electrode layer on a side of an upper surface of the luminescent layer.

14. A manufacturing method of an organic luminescence transistor device according to claim 12, wherein
a step of providing a second electric-charge injection layer made of the same material as or a different material from the electric-charge injection layer on the upper surface of the insulation film is conducted, before the step of providing the first electrode.

* * * * *